United States Patent
Wong et al.

(10) Patent No.: US 8,847,811 B2
(45) Date of Patent: Sep. 30, 2014

(54) SERIAL-RIPPLE ANALOG-TO-DIGITAL CONVERSION

(75) Inventors: Ark-Chew Wong, Irvine, CA (US); Olivier Jacques Nys, Neuchatel (CH); Jonathan Muller, Neuchatel (CH)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 13/369,093

(22) Filed: Feb. 8, 2012

(65) Prior Publication Data

US 2013/0201043 A1 Aug. 8, 2013

(51) Int. Cl.
 *H03M 1/34* (2006.01)
(52) U.S. Cl.
 USPC .......................................... 341/163; 341/155
(58) Field of Classification Search
 CPC ....... H03M 1/362; H03M 1/361; H03M 1/36; H03M 1/34
 USPC .................................. 341/155, 161, 163, 159
 See application file for complete search history.

(56) References Cited

U.S. PATENT DOCUMENTS

| | | | | |
|---|---|---|---|---|
| 5,099,238 A | * | 3/1992 | Whiteley | 341/133 |
| 5,539,406 A | * | 7/1996 | Kouno et al. | 341/155 |
| 5,936,566 A | | 8/1999 | Park | |
| 6,473,013 B1 | * | 10/2002 | Velazquez et al. | 341/120 |
| 7,183,962 B1 | | 2/2007 | Roo et al. | |
| 7,265,704 B1 | * | 9/2007 | Shakya | 341/162 |
| 7,283,083 B1 | * | 10/2007 | Kamal et al. | 341/161 |
| 7,501,972 B2 | * | 3/2009 | Wakamatsu | 341/155 |
| 7,522,085 B1 | * | 4/2009 | Srinvasa et al. | 341/161 |

* cited by examiner

*Primary Examiner* — Brian Young
(74) *Attorney, Agent, or Firm* — McDermott Will & Emery LLP

(57) ABSTRACT

Examples are provided for converting an analog signal to a digital output signal using serial-ripple analog-to-digital conversion (ADC). An ADC circuit may include conversion stages coupled in series. Each conversion stage may generate a bit for the digital output signal. A data latch may receive bits for the digital output signal from the conversion stages and to provide the digital output signal based on the bits. A conversion stage may include a comparator circuit and a multiplexer circuit. The comparator circuit may compare a sampled input signal with a reference signal and to generate the associated bit of the digital output signal based on a result of the comparison. The multiplexer circuit may provide an associated reference signal to a comparator circuit of a next conversion stage, where the next conversion stage is subsequent to the conversion stage.

21 Claims, 25 Drawing Sheets

US 8,847,811 B2

SERIAL-RIPPLE ANALOG-TO-DIGITAL CONVERSION

FIELD

The disclosure relates in general to analog-to-digital conversion (ADC), and more particularly to, serial-ripple ADC.

BACKGROUND

Analog-to-digital conversion (ADC) is often used to sample analog signals so that such signals may be digitally represented. The need for digital representation of analog signals arises in a variety of applications such as digital communication receivers.

A variety of techniques to perform ADC are well known in the art. Two common techniques include the successive approximation (SA) ADC and the flash ADC circuit. An SA ADC circuit generally produces a digital representation by processing an analog input signal through successive steps, at each step a comparison is performed to get a successively more accurate digital representation of the analog input signal. In a typical flash ADC circuit, an analog input signal value is compared with various reference levels, all at once, using multiple comparators. All other things being equal, because in a flash ADC circuit the signal is simultaneously compared with different reference levels in a single step, instead of in multiple steps as in an SA ADC, a flash ADC circuit may typically produce a digital representation of the analog signal with a lower latency than in a SA ADC circuit. Therefore, the flash ADC technique is generally considered more suitable for a high-speed application.

SUMMARY

In one aspect, examples are provided for converting an analog input signal to a digital output signal using serial-ripple analog-to-digital conversion (ADC). An ADC circuit may include a number of conversion stages coupled in series. Each conversion stage may be configured to generate a bit for the digital output signal. A data latch may be configured to receive bits for the digital output signal from the conversion stages and to provide the digital output signal based on the bits. A conversion stage may include a comparator circuit and a multiplexer circuit. The comparator circuit may be configured to compare a sampled input signal with a reference signal and to generate the associated bit of the digital output signal based on a result of the comparison. The multiplexer circuit may be configured to provide an associated reference signal to a comparator circuit of a next conversion stage, where the next conversion stage is subsequent to the conversion stage.

It is understood that various configurations of the subject technology will become readily apparent to those skilled in the art from the disclosure, wherein various configurations of the subject technology are shown and described by way of illustration. As will be realized, the subject technology is capable of other and different configurations and its several details are capable of modification in various other respects, all without departing from the scope of the subject technology. Accordingly, the summary, drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Figure 1A:
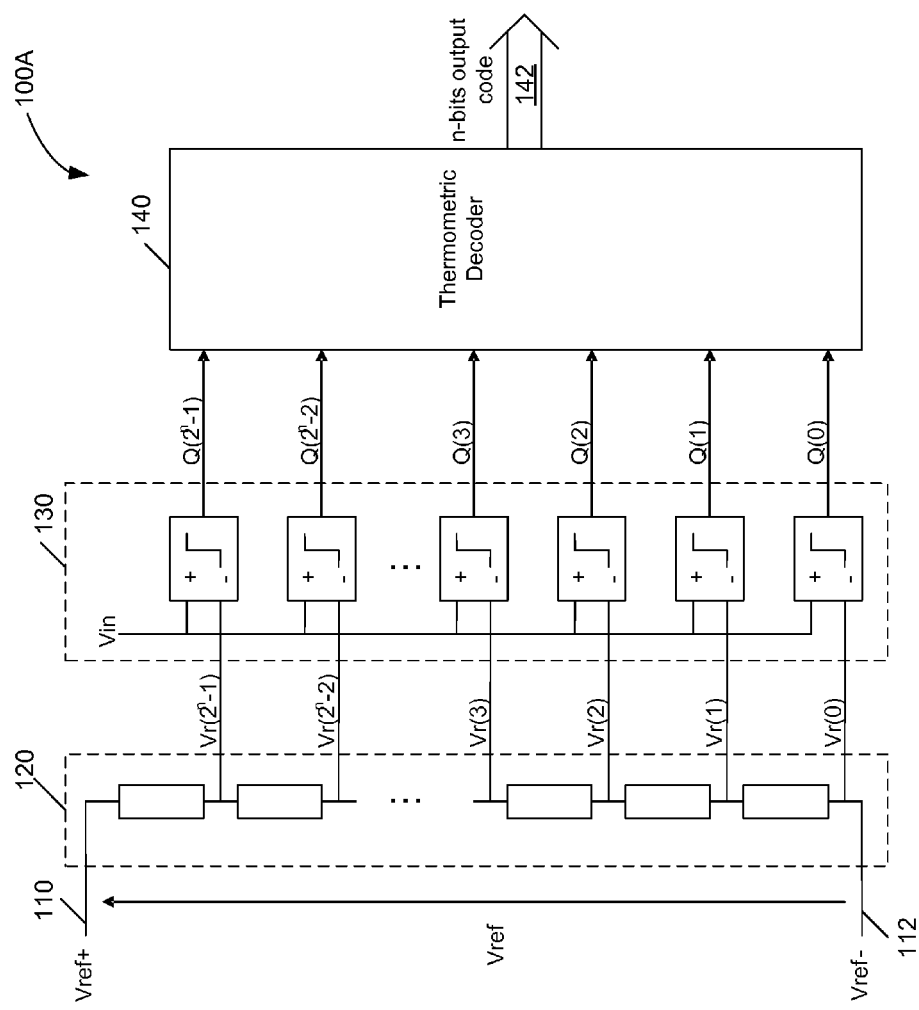
FIG. 1A is a block diagram of an example of a flash analog-to-digital converter (ADC) circuit.

FIG. 1A is a block diagram of an example of a flash analog-to-digital converter (ADC) 100A. Flash ADC circuit 100A includes a reference voltage divide circuit 120, a comparator circuit 130, and a thermometric decoder 140. Reference voltage divide circuit 120 divides a reference voltage, Vref, applied to ports 110 and 112 of reference voltage divide circuit 120 into a number (i.e., n, e.g., 4, 8, 16, etc.) of sub-reference voltages, $Vr(0)$-$Vr(2^n-1)$. Each of sub-reference voltages is compared, by a comparator of comparator circuit 130, with the input analog signal Vin. The comparison results, Q(0)-Q($2^n$-1), are received by thermometric decoder 140 and converted to an n-bit output signal 142.

The drawback of this architecture is that comparator circuit 130 needs to have a high number of comparators and the offset voltages of the comparators is required to be less than half of the value of the least significant bit (LSB) of the input signal. Otherwise, the output code 142 of the comparator circuit 130 may not be guaranteed as a thermometric signal and the monotonicity of the conversion may not be ensured. Therefore, the application of this architecture may be limited to low resolution (e.g., less than six bits) conversions.

Figure 1B:
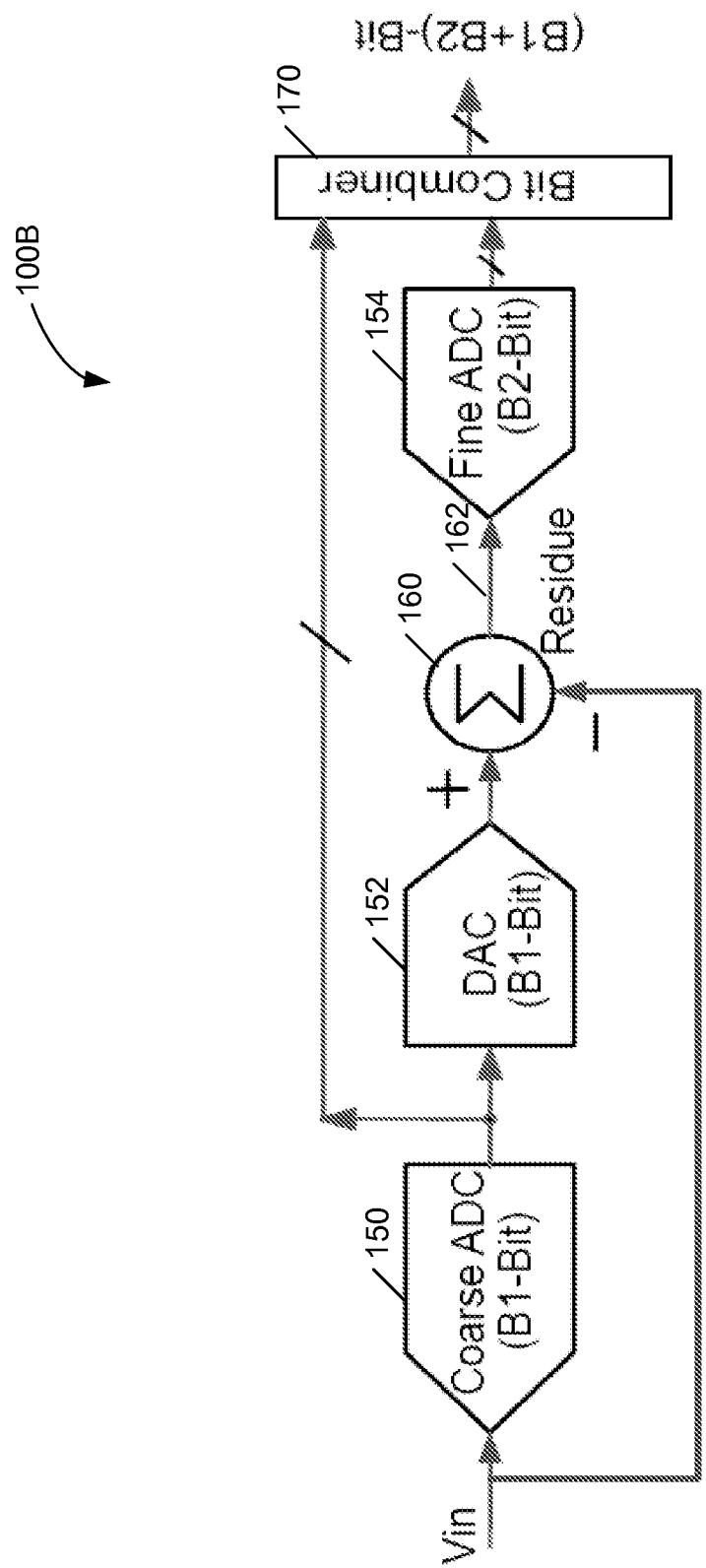
FIG. 1B is a block diagram of an example of a 2-step ADC circuit.

FIG. 1B is a block diagram of an example of a 2-step ADC circuit 100B. The ADC circuit 100B includes a coarse ADC 150, a digital-to-analog converter (DAC) 152, a sum circuit 160, a fine ADC 154, and a bit combiner 170. Coarse ADC 150 converts input voltage signal Vin to a B1-bit (e.g., 5-bit) digital signal. DAC 152 converts the B1-bit digital signal back to an intermediate analog signal. In sum circuit 160 the input voltage signal Vin is subtracted from the intermediate analog signal to generate a residue 162, which is then converted, by fine ADC 154 to a B2-bit (e.g., 3-bit) digital signal. The bit combiner 170 combines the B1-bit and B2-bit digital signals to produce a (B1+B2)-bit (e.g., 8-bit) digital output signal.

Figure 2:
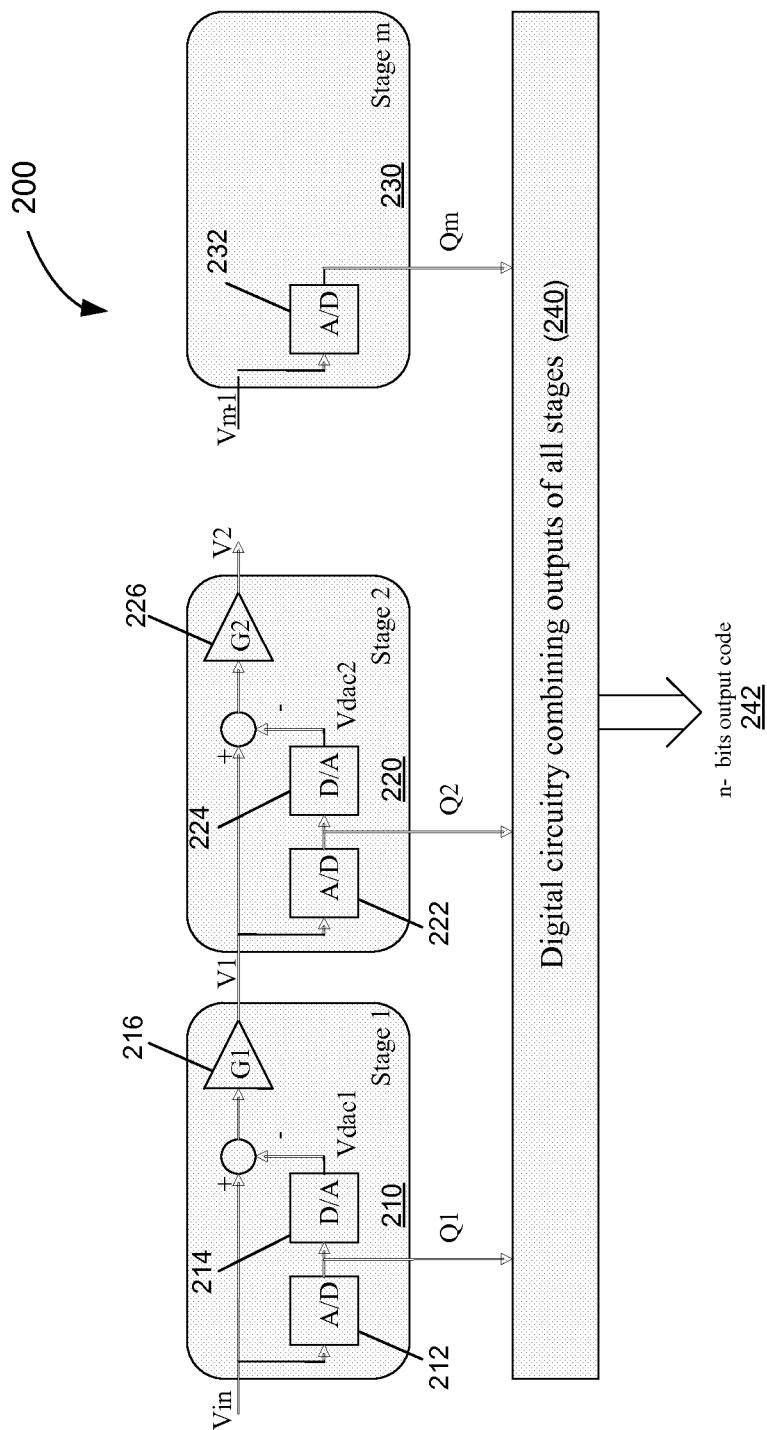
FIG. 2 is a block diagram of an example of a pipeline ADC circuit.

FIG. 2 is a block diagram of an example of a pipeline ADC circuit 200. Pipeline ADC circuit 200 includes a number of stages (e.g., stages 210, 220, and 230) and a digital combining circuit 240. In each stage (e.g., one of stages 210, 220, or 230), the input signal (e.g., one of Vin, V1, V2, or Vm−1) may first be sampled and then quantified by a coarse ADC (e.g., a small flash ADC with low resolution, such as one of 212, 222, or 232) in order to obtain a coarse code Qi (e.g., Q1, Q2, . . . , Qm). This digital estimation of the signal (i.e., Qi,) may then be reconverted back into the analog domain (e.g., signals Vdac1 or Vdac2) by a feedback DAC (e.g., one of 214, or 224), and then subtracted from the sampled input signal of the stage (e.g., one of Vin, V1, or V2,). The result of the subtraction may be amplified with a gain stage Gi (e.g., gain stages G1-216 or G2-226), in order to obtain a residue voltage Vi (e.g., V1, V2, or Vm−1), which may be interpreted an image of the quantization error at the output of the i-th gain stage Gi. By evaluating this quantization error in the next stage of the pipeline, the estimation can be refined. For the last stage of the pipeline (i.e., stage 230), however, the quantized signal is not reconverted back into analog to generate a residue voltage (e.g., Vm).

Given the range of the input signal voltage (e.g., Vin) of the ADC is, for example, between 0V and Vref, and if this range also corresponds to the range of input voltage of coarse ADCs (e.g., one of 212, 222, or 232) within each stage, the output range of each DAC (e.g., 214, or 224) is also between 0 and Vref, and the output voltage Vdac1 in each stage is equal to Qi*Vref, with Qi being a value (between 0 and 1) corresponding to the output code of the ADC of the i-th stage (i.e., also the input code of the DAC). Thus, one has:

$$V1 = G1*(Vin - Vdac1) = G1(Vin - Q1*Vref)$$

$$V2 = G2*(V1 - Vdac2) = G2(V1 - Q2*Vref)$$

$$V3 = G3*(V2 - Vdac3) = G3(V2 - Q3*Vref)$$

Reverting these equations gives:

$$Vin = Vref*Q1 + V1/G1$$

$$V1 = Vref*Q2 + V2/G2$$

$$V2 = Vref*Q3 + V3/G3$$

and combining these equations results in:

$$Vin = Vref*(Q1 + Q2/G1) + V2/(G1*G2)$$

On the other hand, if a 3d pipeline stage is also taken into account:

$$Vin = Vref*(Q1 + Q2/G1 + Q3/(G1*G2)) + V3/(G1*G2*G3).$$

Practically, the gain G1 and G2 for the residue amplifiers 216 and 226 are analog gains (e.g., ratio of capacitor values) but correspond nominally to an integer number, generally even to powers of 2 (neglecting the mismatches and gain errors), so that they can easily be mapped into the digital domain as multiplying factors in the digital circuitry combining the outputs from the different stages. Thus if the output code is computed in the digital domain as:

$$Code = K1*Q1 + K2*Q2 + K3*Q3$$

with K1=1, K2=K1/G1=1/G1, and K3=K2/G2=1/(G1*G2), one obtains:

$$Vin = Vref*Code + V3/(G1*G2*G3).$$

which indicates that the output code is proportional to the input signal voltage and thus can represent the input signal voltage, with a quantization error proportional to V3/(G1*G2*G3) that represents the residue of the last stage. The gain performed in each stage generally corresponds to $2^k$, where k is the number of bits solved in the stage, so that the quantization error referred to the input becomes smaller and smaller when increasing the number of stages. For instance if two bits are resolved per stage, the residue can be amplified by four in each stage.

With the pipeline ADC circuit 200, the precision is not limited by the precision of the coarse ADC (i.e., thresholds of the comparators), as, by using redundancy techniques, small errors at the decision in the first stages can be compensated in the following stages. However, the precision is strongly constrained by the precision of the DACs (e.g., 214 or 224) in the feedforward path of each stage and by the precision of the gains of the residue amplifier Gi (e.g., 216 or 226). Given that, for instance, a 10-bit resolution is desired, and that 2 bits are extracted from the first stage. This implies that the residue V1 of the first stage is evaluated with a precision of 8 bits, which indicates that the gain error for the gain G1 of the first gain stage 216 has a precision roughly better than 1/256=0.4%. This may impose severe constraints on the settling of the residue amplifier, mainly when operating at high speeds.

Figure 3:
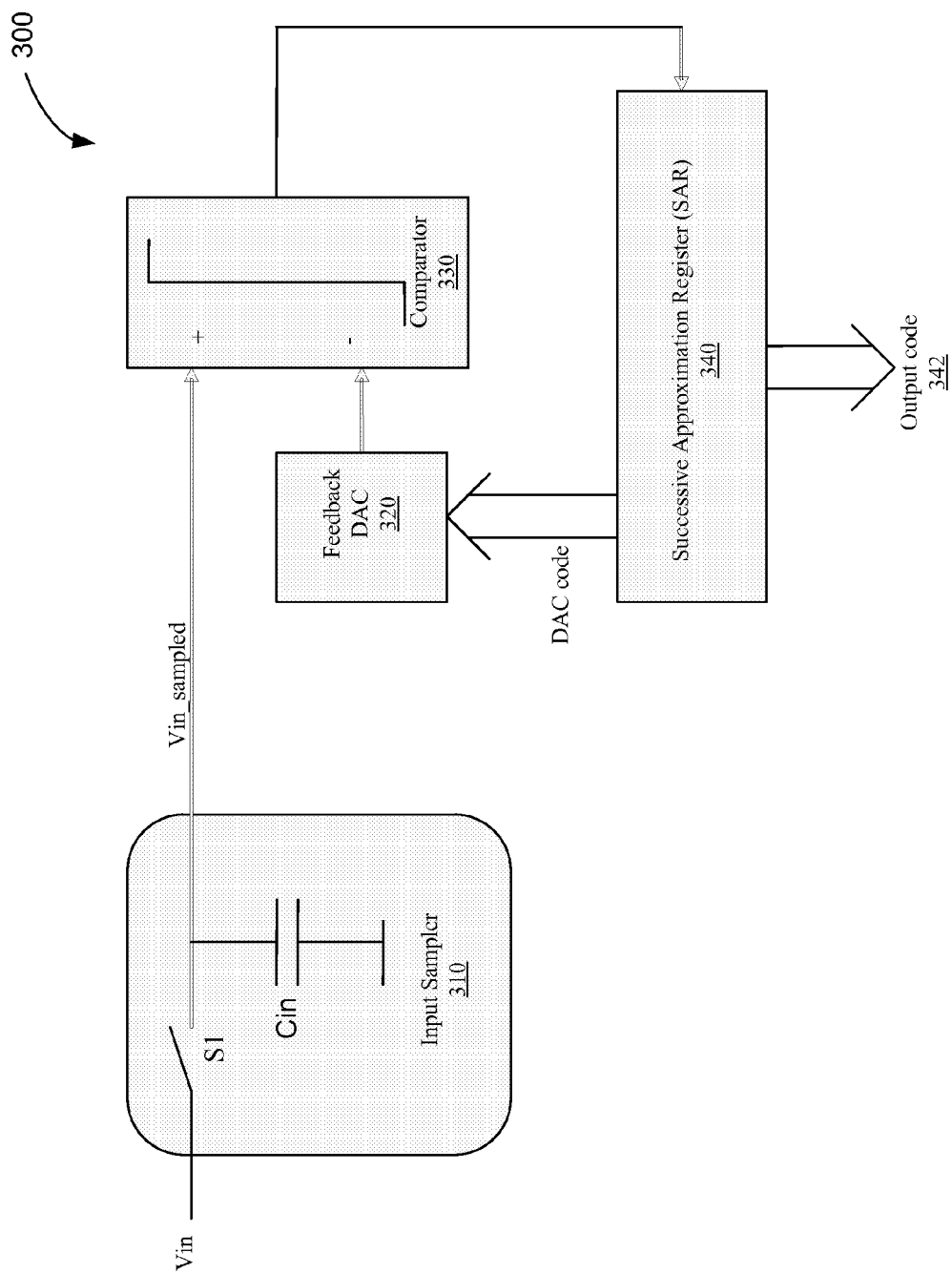
FIG. 3 is a block diagram of an example of a successive approximation (SA) ADC circuit.

FIG. 3 is a block diagram of an example of a successive approximation (SA) ADC circuit 300. ADC circuit 300 may include an input sampler 310, a feedback DAC 320, a comparator 330 and an SAR 340. Input sampler 310 may include a switch S1 and a capacitor Cin and can be configured to sample the input signal voltage (e.g., Vin) to generate the sampled input signal voltage, which may be compared with output signal of feedback DAC 320, by comparator 330. SAR 340 generates the successive input codes of feedback DAC 320, with respect to which the sampled input signal voltage can be compared. SAR 340 receives the comparison results and based on the received comparison result determines the output code 342.

The operation of ADC circuit 300 includes finding a DAC level that best approximates the sampled input signal voltage and generally results in a dichotomy. In one aspect, the operation of ADC circuit 300 consists of finding a DAC level that best approximates the sampled input signal voltage. Consider, for example, a scenario in which the range of the input signal voltage of ADC circuit 300 and the output range of the feedback DAC 320 are between zero and Vref and the resolution of the ADC circuit 300 and of the feedback DAC 320 is 8 bits. In this scenario, at the beginning of the operation, the input voltage is known to be in the range between 0 and Vref. At the first step, the input signal voltage is compared with Vref/2 by applying a DAC code 1000 0000 to the feedback DAC 320. If the resulting bit (e.g., output of comparator 330) is high, then the input signal voltage is known to be higher than Vref/2 and thus between Vref/2 and Vref, otherwise the input signal voltage is between zero and Vref/2. The uncertainty (i.e., the interval that the input voltage is known to be in) is thus reduced by a factor of two. For instance, if the first bit was zero, the next code applied to the feedback DAC 320 is 0100 0000 in order to generate voltage Vref/4, which the input voltage will then be compared with. If the second bit is low, the input voltage is known to be in the interval from zero to Vref/4, otherwise in the interval between Vref/4 and Vref/2, and the uncertainty is again reduced by a factor of two. In the last case, for example, the third code applied to the feedback DAC 320 is 0110 0000, which generates a voltage level of ⅜*Vref, and so on. Consequently, at each step, one bit is solved and the uncertainty is divided by two.

Figure 4:
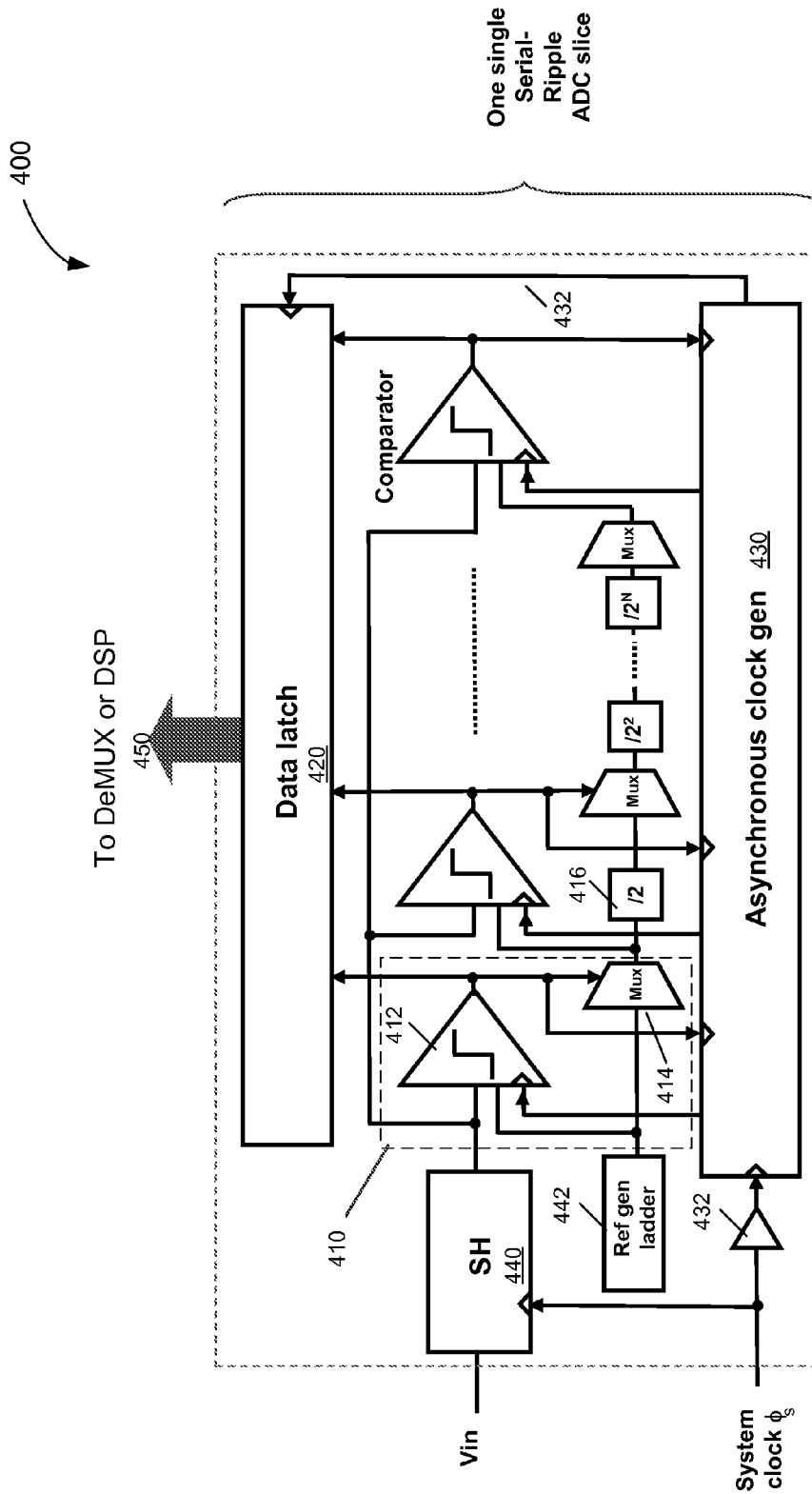
FIG. 4 is a block diagram illustrating an example of a serial-ripple ADC circuit.

FIG. 4 is a block diagram illustrating an example of a serial-ripple ADC circuit 400. Serial-ripple ADC circuit 400 may include a number of (e.g., 8, for an 8-bit ADC) conversion stages 410, a data latch circuit 420, an asynchronous clock generator 430, a sample-and-hold (SH) circuit 440, and a reference generator circuit 442. Serial-ripple ADC circuit 400 can convert an analog input signal (e.g., Vin) to a digital output signal 450. SH circuit 440 may sample analog input signal Vin, at a rate dictated by a frequency of a system clock (e.g., $\phi_s$), and provides a sampled input signal to first conversion stage 410. Asynchronous clock generator 430 may receive system clock $\phi_s$ and generate clock pulses to trigger comparator circuits 412 of the conversion stages 410 such that they can operate serially and subsequently in an ordered sequence. The first conversion stage 410 sets the most significant bit (MSB) of the digital output signal 450 and the last conversion stage 410 sets the least significant bit (LSB) of the digital output signal 450.

Each conversion stage 410 may include a comparator circuit 412, and a multiplexer 414 (except for the last conversion stage that does not need a multiplexer). For simplicity only components of the first conversion stage are indicated with reference number. However, the same reference numbers may apply to other conversion stages of serial-ripple ADC circuit 400. Comparator circuit 412 triggered by a clock pulse (e.g., a system clock $\phi_s$, or a clock pulse generated by asynchronous clock generator 430) may compare the sampled input signal with a reference signal. Comparator circuit 412 may set a bit of the digital output signal 450 based on the comparison result. The bit may be set to "1" if the sampled input signal is greater than the reference signal. Otherwise, the bit may be set to "0" The reference signals are generated by reference generator 442 and provided to the comparator circuit 412 and multiplexer circuit 414 of the first conversion stage 410. Multiplexer circuit 414 may receive a number of reference signals from the reference generator 442 and select one of the reference signals to provide that reference signal to the comparator circuit 412 of a next conversion stage 410. Multiplexer circuit 414 may select one of the reference signals based on one or more select signals. More details of the selection process will be discussed herein in connection with FIGS. 5A-5C. The divide-by-2 (i.e., /2) blocks (e.g., block 416) are virtual blocks and are shown merely to indicate that moving down the line form the first comparator 412 to the last comparator, the range of the reference voltages is divided by 2 at each comparator, as will be discussed herein with respect to FIGS. 5A-5C. Data latch 420 can store bits of digital output signal 450 as set by conversion stages 410 and provide digital output signal 450 to any external circuit (e.g., a demultiplexer or a digital signal processing (DSP) circuit) when triggered by a clock pulse 432 generated by asynchronous clock generator 430. Asynchronous clock generator 430 may generate clock pulse 432 upon completion of the decision making by comparator circuit 412 of the last conversion stage 410

Figure 5A:
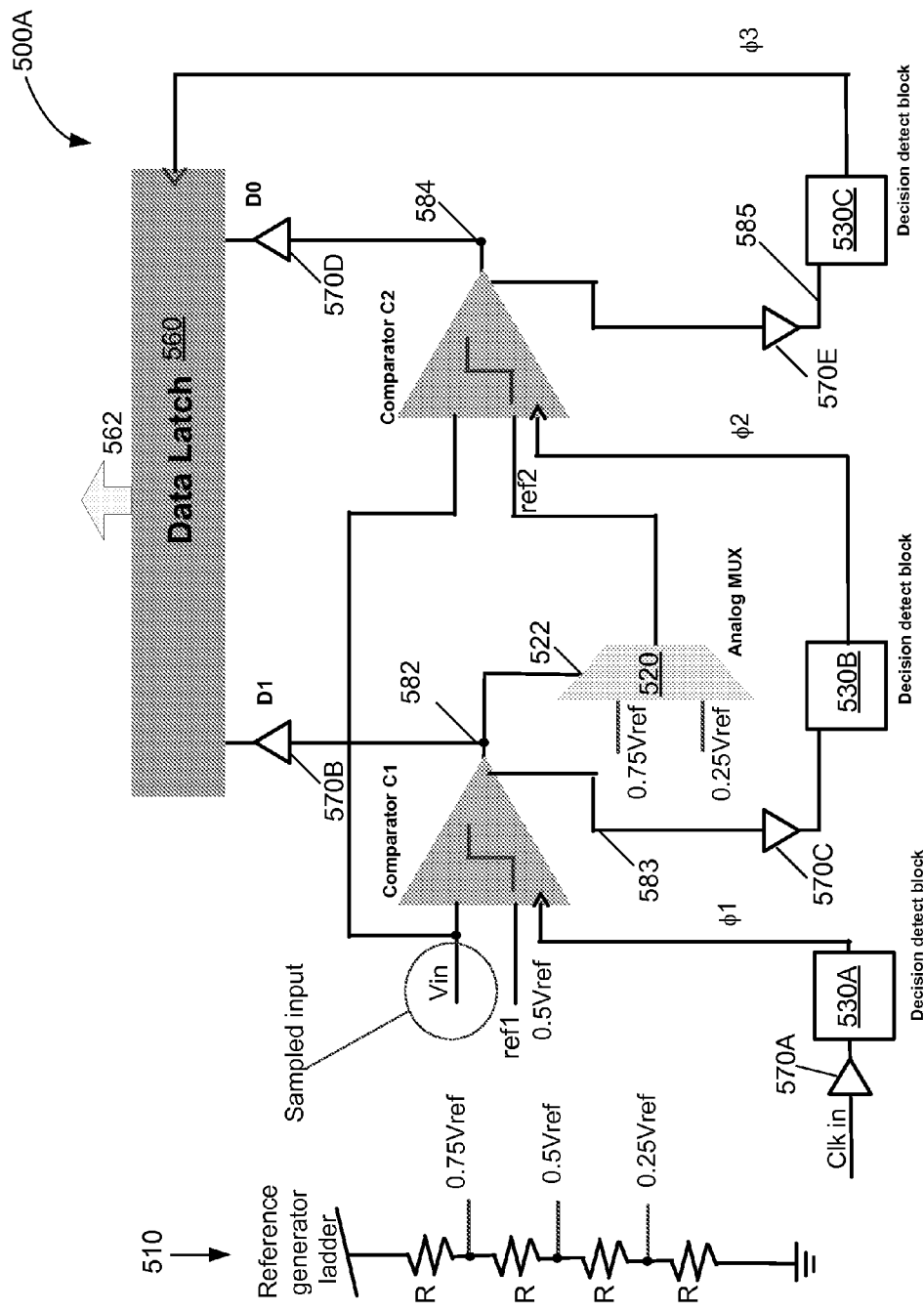
FIGS. 5A-5D are block diagrams illustrating examples of 2-bit, 3-bit, 4-bit and N-bit serial-ripple ADC circuits.

FIGS. 5A-5D are block diagrams illustrating examples of 2-bit, 3-bit, 4-bit and N-bit serial-ripple ADC circuits. FIG. 5A shows a 2-bit serial-ripple ADC circuit 500A, which includes a reference generator ladder 510, comparators C1 and C2, analog multiplexer (herein after "MUX") 520, decision detect circuits (e.g., blocks) 530, data latch 560, and buffer circuits (e.g., buffers) 570A to 570E. Reference generator ladder 510 provides three reference signals at levels 0.25 Vref, 0.50 Vref, and 0.75 Vref, where Vref is a reference voltage, magnitude of which is defined by the maximum value of the input analog signal. Comparator C1 compares the sampled input signal Vin with the midrange reference signal ref1 (i.e., 0.50 Vref) upon receiving of a clock pulse $\phi_1$ generated by the decision detect block 530A. If the sampled input signal is greater that 0.50 Vref, the output signal 582 of comparator C1 switches to a logical high state, which sends a "1" bit through buffer 570B to data latch 560 to set the MSB of the digital output signal (i.e., bit D1) to "1". Otherwise, If the sampled input signal is less that 0.50 Vref, the output signal 582 of comparator C1 switches to a logical low state, which sends a "0" bit through buffer 570B to data latch 560 to set the MSB of the digital output signal to "0".

Completion of the decision making by comparator C1, marked by a completion signal 583 derived based on settling of the output signal 582 of the comparator C1, triggers start of conversion of the next conversion stage including comparator C2. Comparator C2 is triggered by a clock pulse $\phi_2$, which is generated by decision detect block 530B. Decision detect block 530B generates clock pulse $\phi_2$ in response to receiving completion signal 583 of comparator C1 through buffer 570C. More detail description of the structure and operation of decision blocks 530A to 530C are provided with respect to FIG. 8 discussed below. Comparator C2 compares the sampled input signal with a reference signal ref2 provided by MUX 520. MUX 520 receives reference signals 0.25 Vref, and 0.75 Vref from reference generator ladder 510 and selects one of the reference signals (i.e., ref2) based on a value of a select signal (e.g., signal 582) at a select input 522. Select input 522 of MUX 520 is coupled to the output of comparator C1, so the select signal is the same as output signal 582 of comparator C1. For example, if output signal 582 of comparator C1 is at logical high state, the reference signal 0.75 Vref is selected, otherwise the reference signal 0.25 Vref is selected (as shown in decision tree of FIG. 6A) and provided as reference signal ref2 to comparator C2. Comparator C2, upon completion of its decision making provides output signal 584, which is sent through buffer 570D to data latch 560 to set the LSB of the digital output signal (i.e., bit D0). A completion signal 585, derived based on settling of the output signal 584 of the comparator C2, is provided, through buffer 570E, to decision detect block 530C, which in turn generates clock pulse $4_3$ that triggers data latch 560 to provide the digital output signal 562.

Figure 5B:
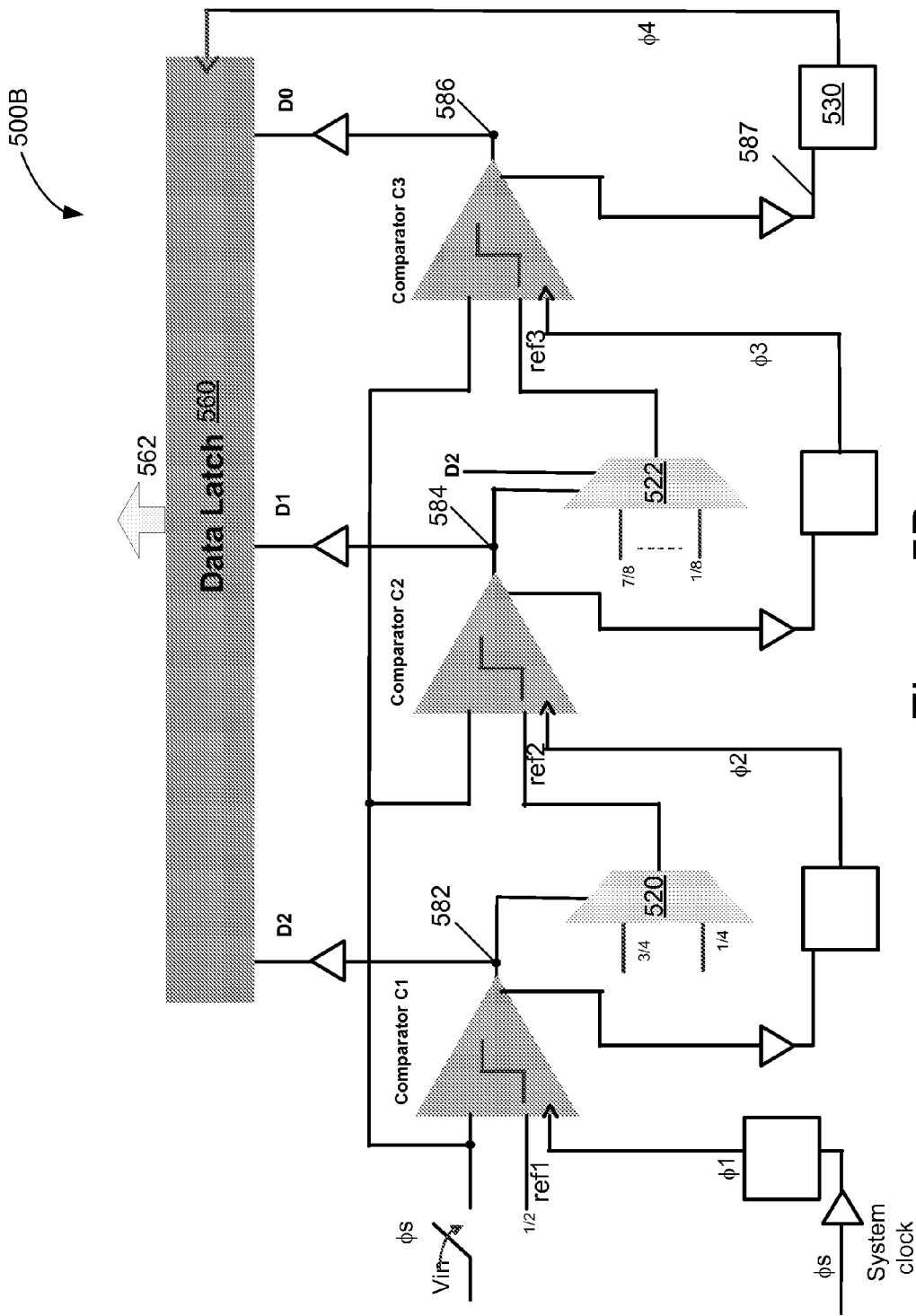

FIG. 5B shows a 3-bit serial-ripple ADC circuit 500B, which is similar to serial-ripple ADC circuit 500A except for the addition of MUX 522, comparator C3 and an extra decision detect block 530 triggered by output signal 586 of comparator C3. The operation of comparators C1 and C2 and MUX 520 are similar to the operation of comparators C1 and C2 and MUX 520 of FIG. 5A, as described above. MUX 522 receives four reference signals (i.e., $\frac{1}{8}$Vref, $\frac{3}{8}$ Vref, $\frac{5}{8}$Vref, and $\frac{7}{8}$Vref) from a reference generator ladder similar to reference generator ladder 510 of FIG. 5A (not shown in FIG. 5B for simplicity). MUX 522 may select one of the reference signals, based on the values of bits D2 and D1 set by output signals 582 and 584 of comparators C1 and C2, to provide reference signal ref3 to comparator C3. More detail description of the selection process is discussed below with respect to FIG. 6B. Comparator C3 compares the sampled input signal with reference signal ref3 and upon completion of the comparison, provides output signal 586 at a logical high or low state to data latch 560, to set bit D0 of the digital output signal, depending on the comparison result. If the sampled input signal is greater than reference signal ref3, bit D0 is set to "1", otherwise bit D0 is set to "0". A completion signal 587 derived based on settling of the output signal 586 can also cause decision detect block 530 to send a clock pulse $\phi_4$ to trigger data latch 560 to provide the digital output signal 562 to an external circuit.

Figure 5C:
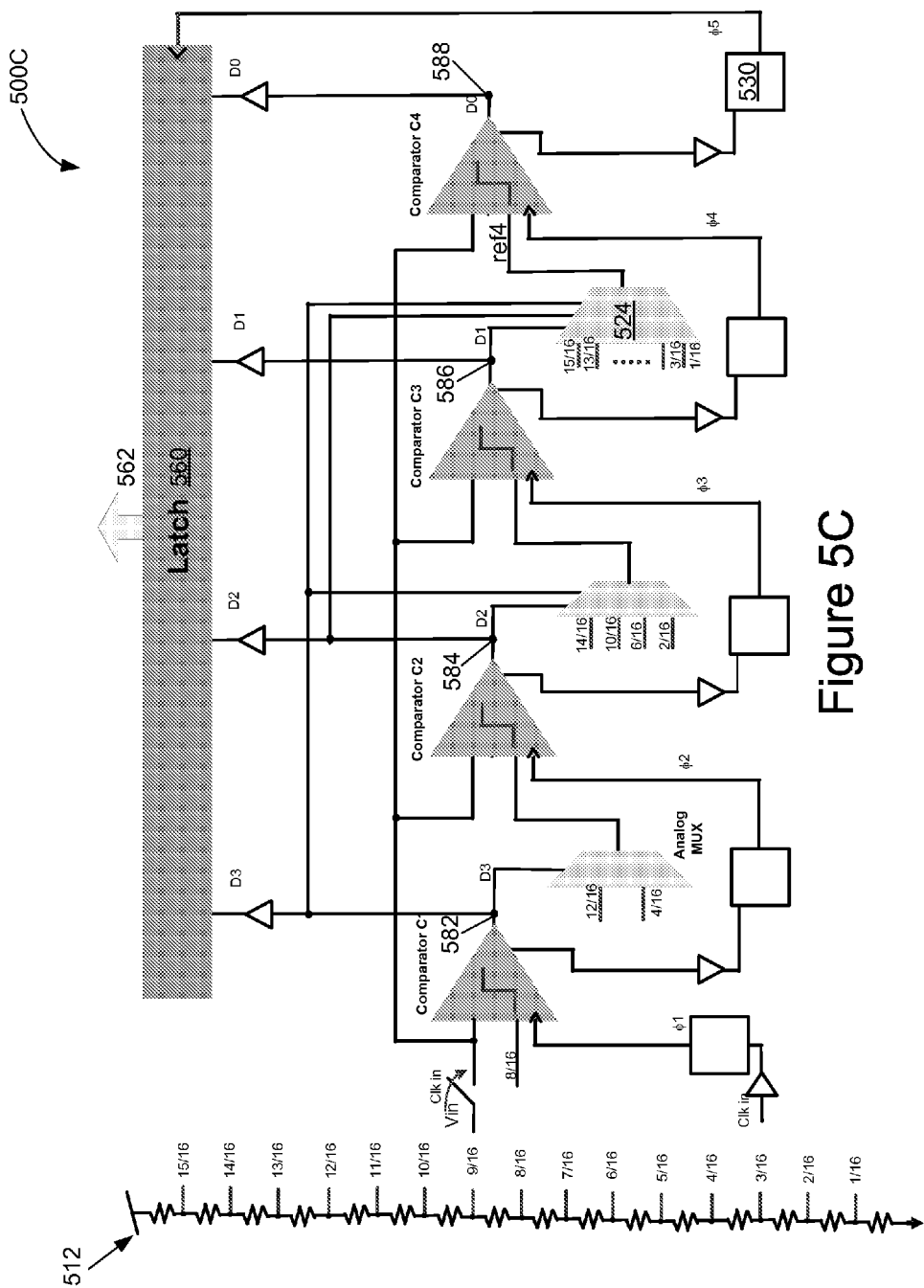

FIG. 5C shows a 4-bit serial-ripple ADC circuit 500C, which is similar to serial-ripple ADC circuit 500B except for the addition of MUX 524, comparator C4 and an extra decision detect block 530 triggered by output signal 588 of comparator C4. MUX 524 receive eight reference signals (i.e., $\frac{1}{16}$Vref, $\frac{3}{16}$Vref, $\frac{5}{16}$Vref, $\frac{7}{16}$Vref, $\frac{9}{16}$Vref, $\frac{11}{16}$Vref, $\frac{13}{16}$Vref, $\frac{15}{16}$Vref, as shown in FIG. 6C in the last column) from reference generator ladder 512. MUX 524 may select one of the reference signals, based on the values of bits D3, D2, and D1 set by output signals 582, 584, and 586 of comparators C1, C2, and C3, to provide reference signal ref4 to comparator C4. More detail description of the selection process is discussed below with respect to FIG. 6C. Comparator C4 compares the sampled input signal with reference signal ref4 and upon completion of the comparison, provides output signal 588 at a logical high or low state to data latch 560, to set bit D0 of the digital output signal, depending on the comparison result. If the sampled input signal is greater than reference signal ref4, bit D0 is set to "1", otherwise bit D0 is set to "0".

Figure 5D:
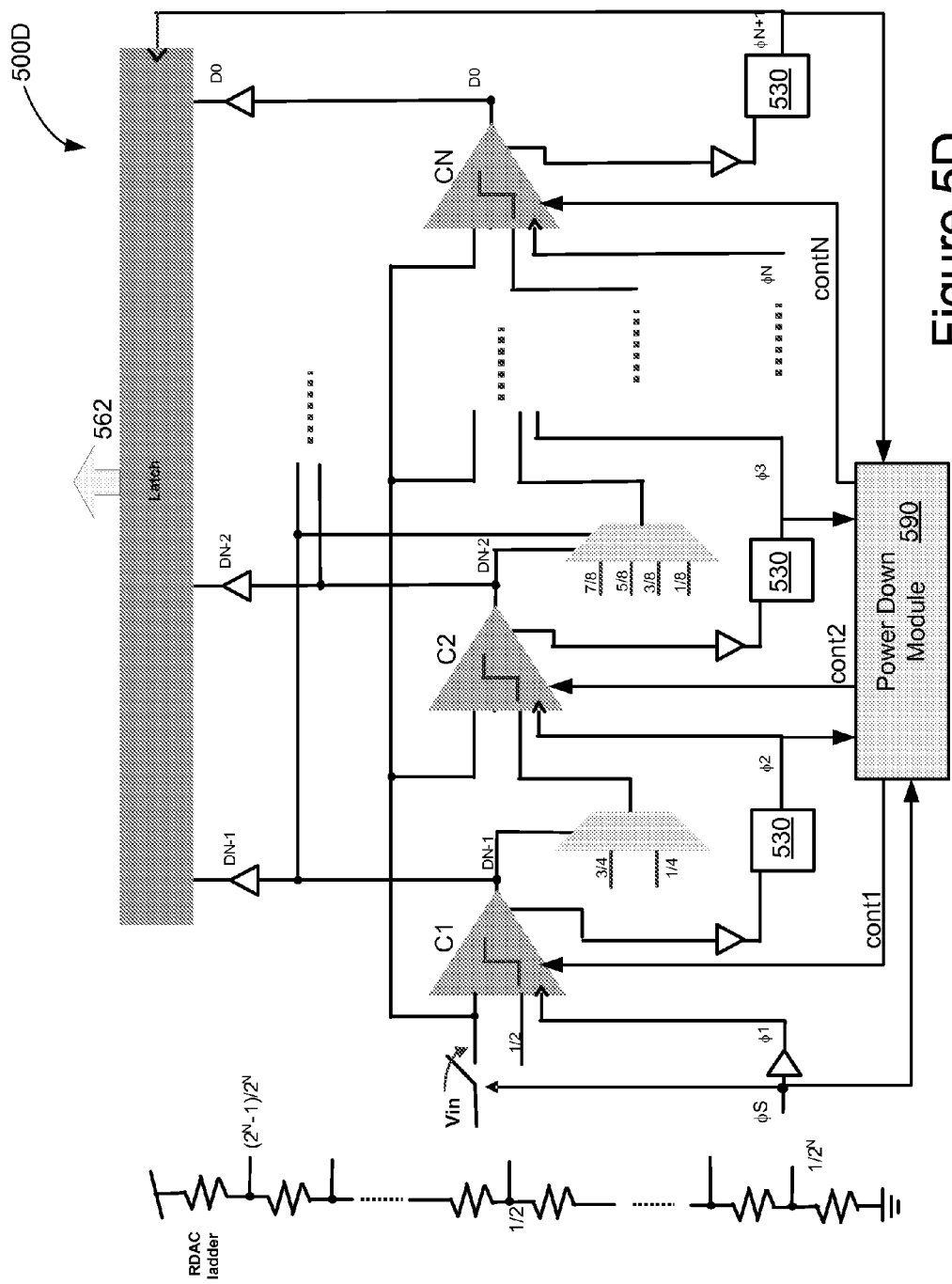

FIG. 5D shows an n-bit serial-ripple ADC circuit 500D, which is similar to serial-ripple ADC circuit 500C except for the addition of (n–4) conversion stages and power down circuit (i.e. module) 590. It is worth mentioning that similar power down module (PDM) can be added to serial-ripple ADC circuits of FIG. 4 and FIGS. 5A-5C, discussed above, to provide similar functionality as described herein. PDM 590 is enabled by the system clock pulse $\phi_s$ and receives clock signals $\phi_2, \phi_3 \ldots \phi_N$ from decision blocks 530 and generate control signals cont 1, cont2 . . . contN. Clock signals $\phi_2, \phi_3 \ldots \phi_N$ indicate completion of comparison operation of comparators C1, C2 . . . CN, respectively and may cause PDM 590 to assert respective control signals cont 1, cont2 contN. Control signals cont1, count 2 . . . countN are generated by clock signals $\phi_2, \phi_3 \ldots \phi_N$, respectively. Control signals cont 1, cont2 . . . contN once asserted can cause respective comparators C1, C2 . . . CN to change mode from an active mode to a low power mode (e.g., a quiescent mode) to save power. PDM 590 may be implemented, using known methods, in the form of hardware.

Figure 11A:
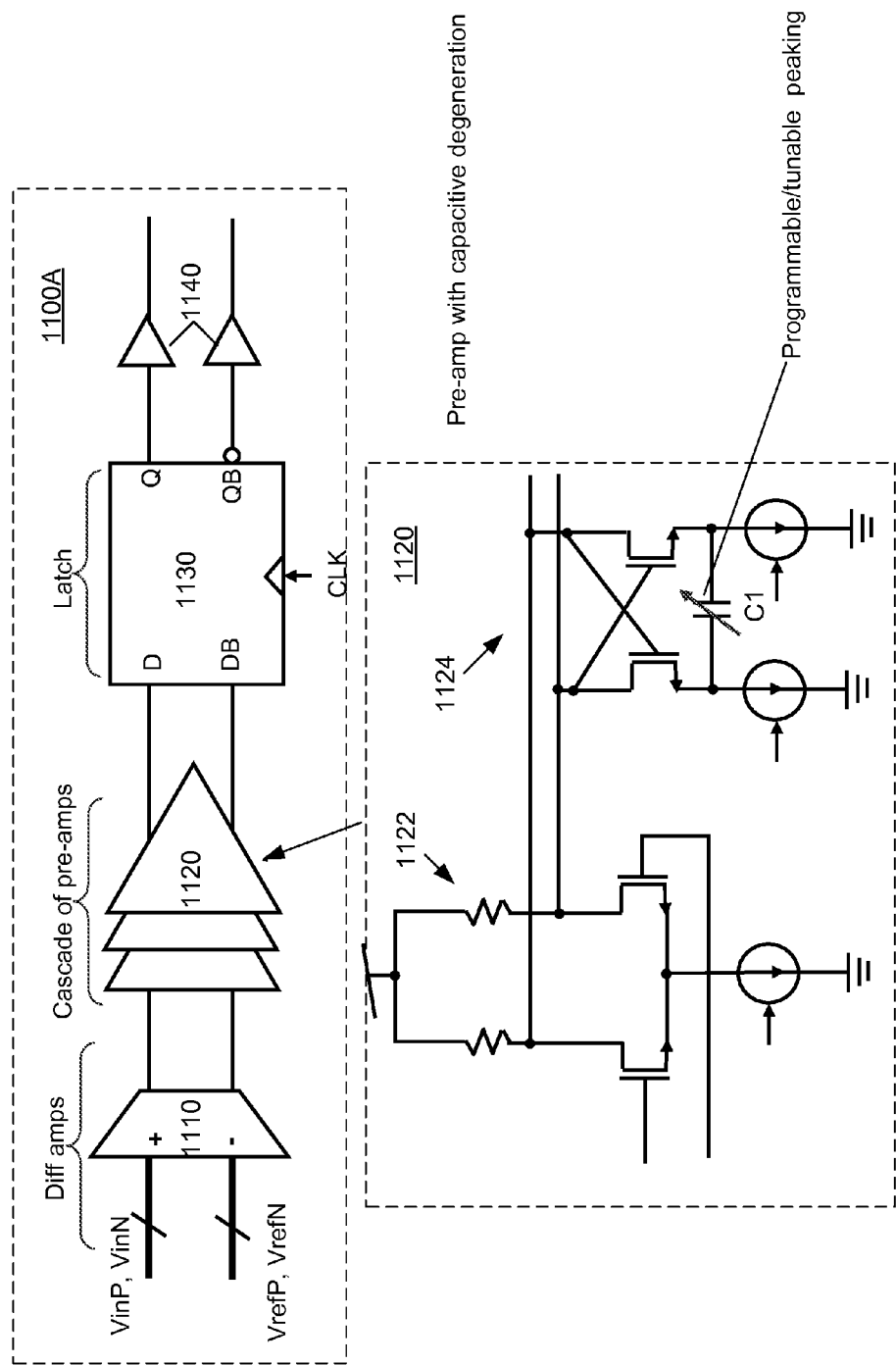
FIGS. 11A-11B are schematic diagrams illustrating exemplary implementations of a comparator circuit of the serial-ripple ADC circuits of FIGS. 5A-5D.
Figure 11B:
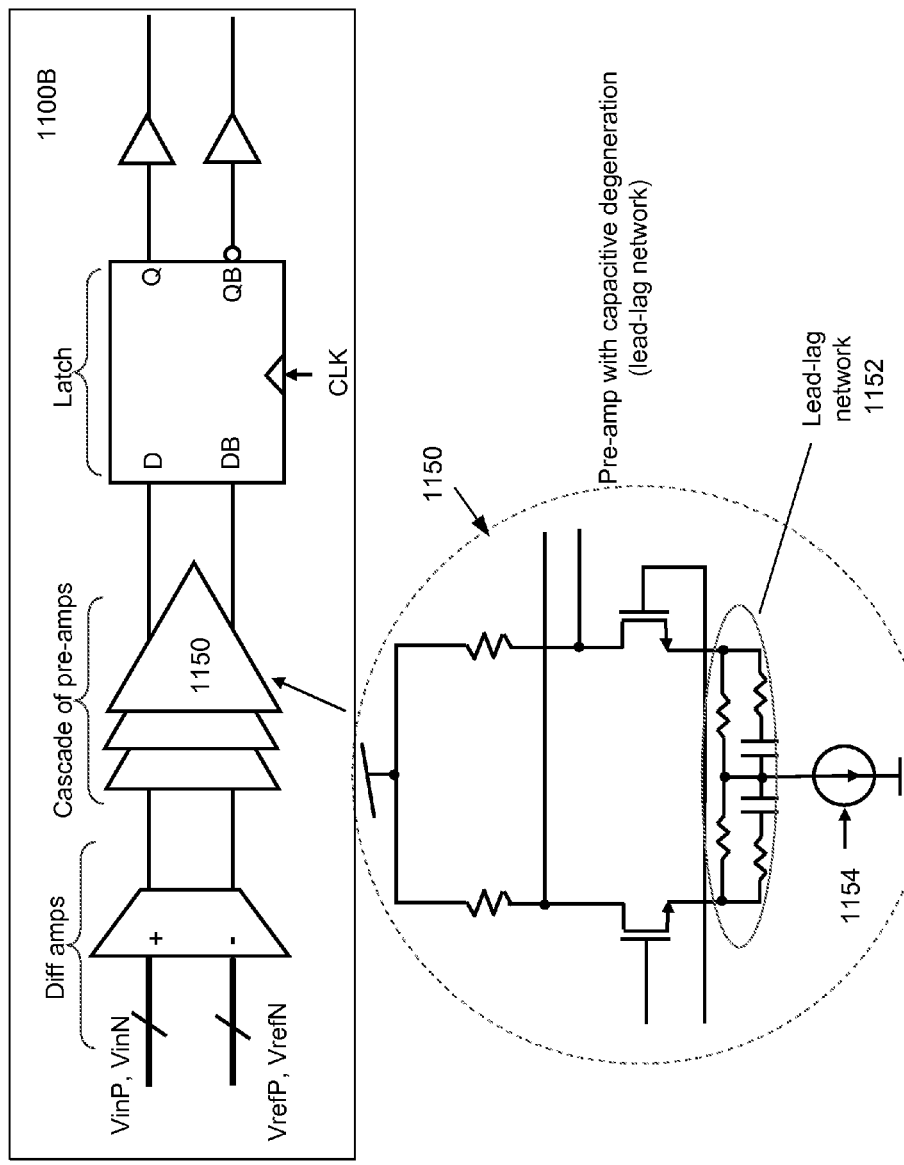

Although the serial-ripple ADC circuits shown in FIG. 4 and FIGS. 5A-5D are presented in single-ended form for simplicity, they can be realized and operate in differential mode as well to enhance their noise rejection properties among other advantages. For example, sample and hold circuits, and comparator circuits can be implemented fully differentially, but the output data per conversion stage still remains single output data. In a differential implementation, the analog multiplexers may provide positive and negative references to positive and negative reference inputs of differential comparators (shown in FIGS. 11A-B). The serial-ripple ADC circuits discussed above can be thought of as serial ripple flash ADC with reduced number of comparators, or parallel successive approximation ADC with increased number of comparators. Due to low offset and high impedance requirements of the comparators, shunt (e.g., peaking) capacitor techniques can be used to improve bandwidth of preamplifiers (as shown in FIGS. 11A-B) without sacrificing on offset requirements.

Figure 6B:
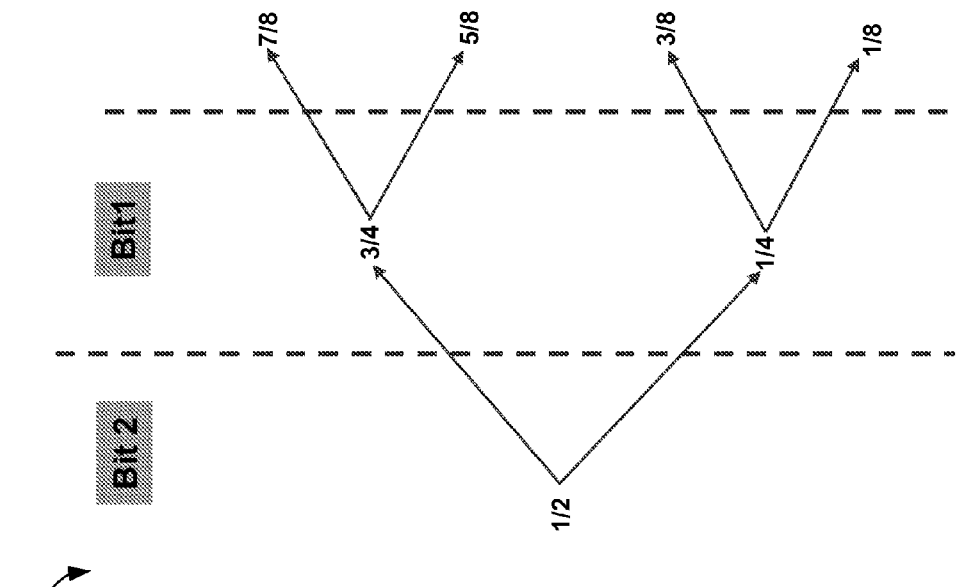
FIGS. 6A-6C are diagrams illustrating examples of ADC decision trees corresponding to the 2-bit, 3-bit, and 4-bit serial-ripple ADC circuits of FIGS. 5A-5C.
Figure 6A:
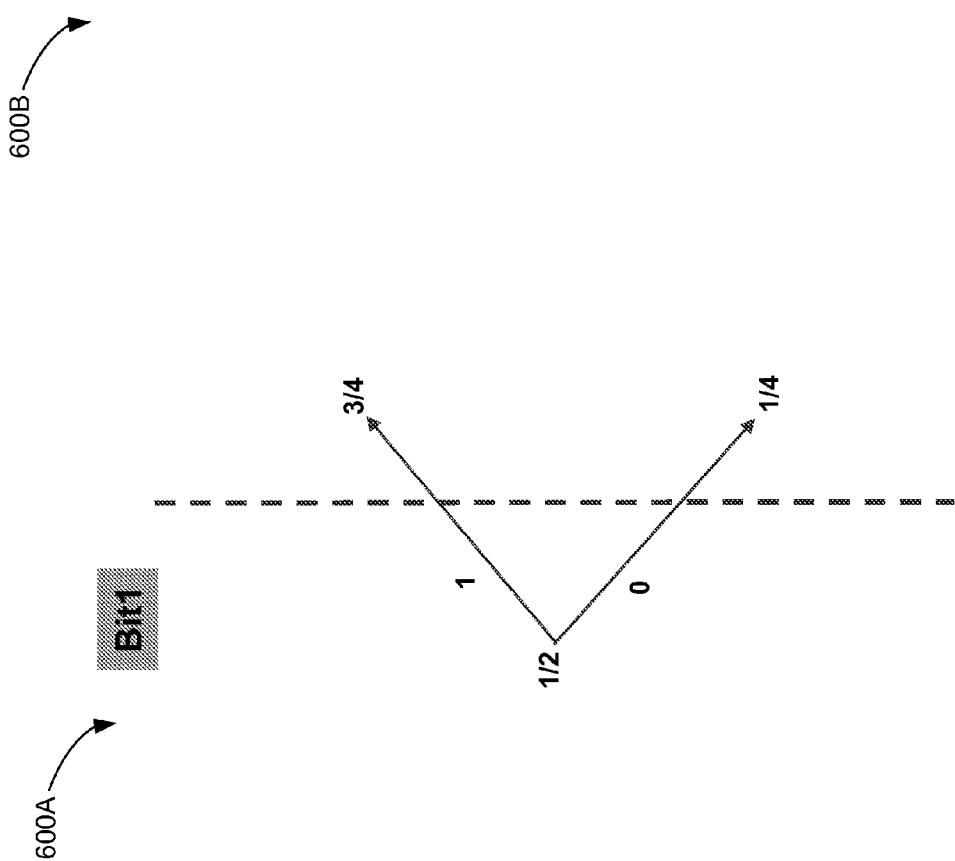
Figure 6C:
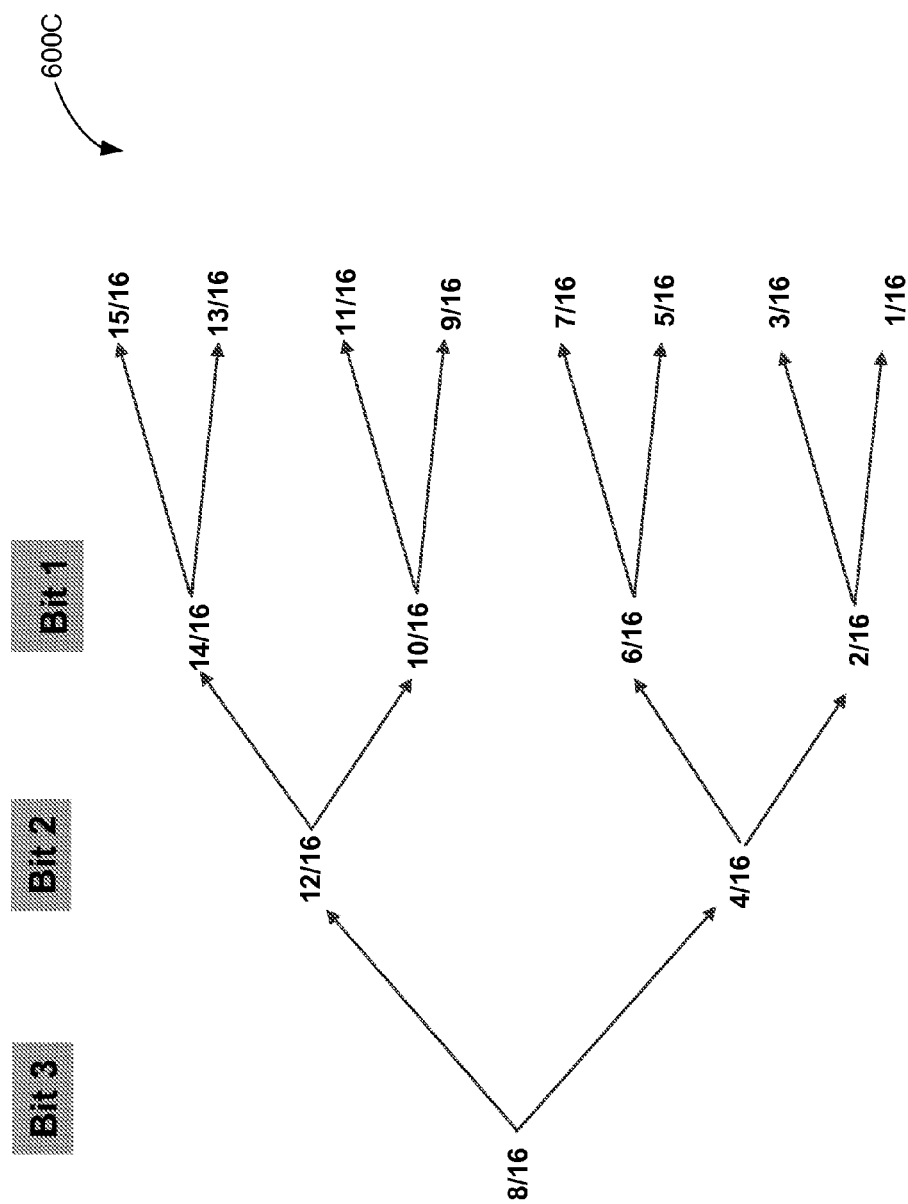

FIGS. 6A-6C are diagrams illustrating examples of ADC decision trees 600A-600C corresponding to the 2-bit, 3-bit, and 4-bit serial-ripple ADC circuits of FIGS. 5A-5C. Bit0, Bit1, Bit2, and Bit3 in these figures are the same as bits D0, D1, D2, and D3 in FIGS. 5A-5C. Decision trees 600A-600C correspond to MUX 520, 522, and 524 of serial-ripple ADC circuits 500A-500C of FIGS. 5A-5C, respectively. Decision tree 600A shows that when Bit1 (i.e., D1 of FIG. 5A) is "1", reference signal $\frac{3}{4}$Vref is selected by MUX 520 and provided as reference signal ref2 to comparator C2, otherwise, reference signal $\frac{1}{4}$Vref is selected to represent ref2.

With respect to decision tree 600B, MUX 522 has to select between four values of reference signals (i.e. $\frac{1}{8}, \frac{3}{8}, \frac{5}{8},$ and $\frac{7}{8}$ of Vref). MUX 522 make decision based on values of Bit2 and Bit1 (i.e., D2 and D1 of FIG. 5B). If D2 is "0" depending on the value of D1, being "0" or "1", the reference signal $\frac{1}{8}$ Vref or $\frac{3}{8}$ Vref is selected to be provided as ref3 to comparator C3 of FIG. 5B. If D2 is "1" depending on the value of D1, being "0" or "1", the reference signal $\frac{5}{8}$ Vref or $\frac{7}{8}$ Vref is selected to be provides as ref3 to comparator C3 of FIG. 5B. Decision tree 600C corresponds to MUX 524 of FIG. 5C, where bits D3, D2, and D1 are the determining bits for selection of the reference signal ref4 provided by MUX 524 to comparator C4. In light of the above description of decision trees 600A and 600B, decision tree 600C is self explanatory.

Figure 7A:
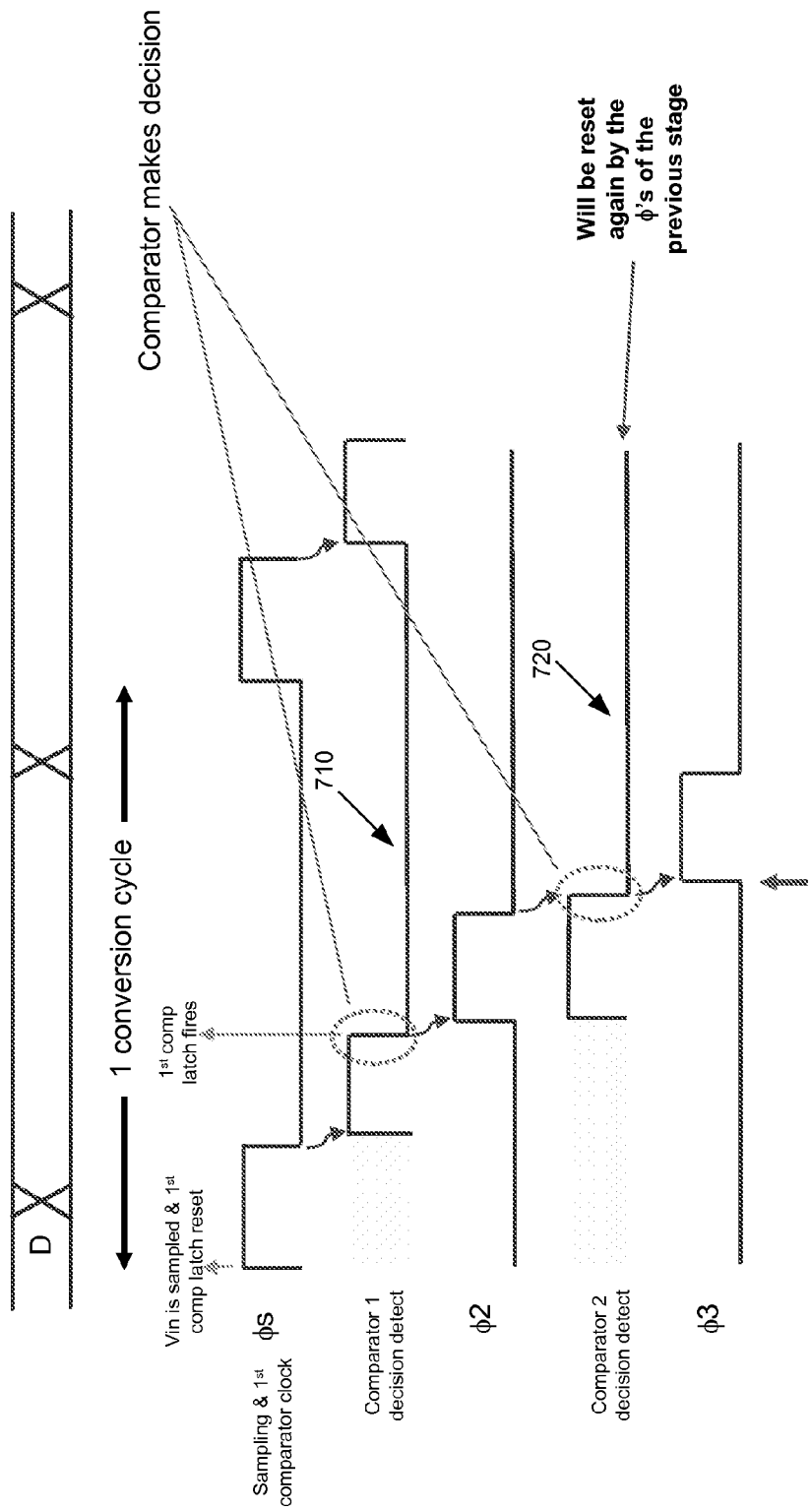
FIGS. 7A-7C are timing diagrams illustrating examples of clock pulses corresponding to the 2-bit, 3-bit, and 4-bit serial-ripple ADC circuits of FIGS. 5A-5C.
Figure 7B:
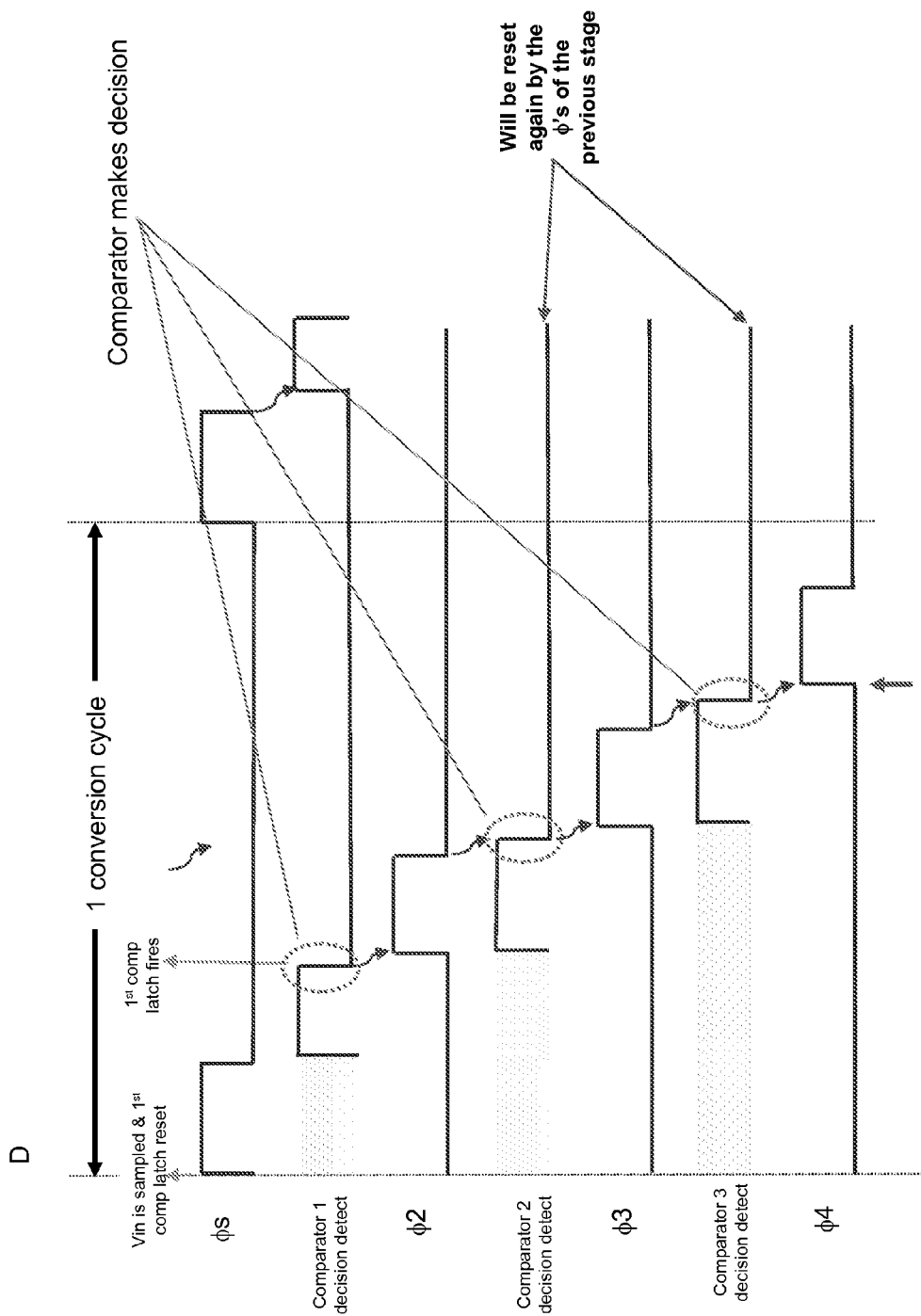
Figure 7C:
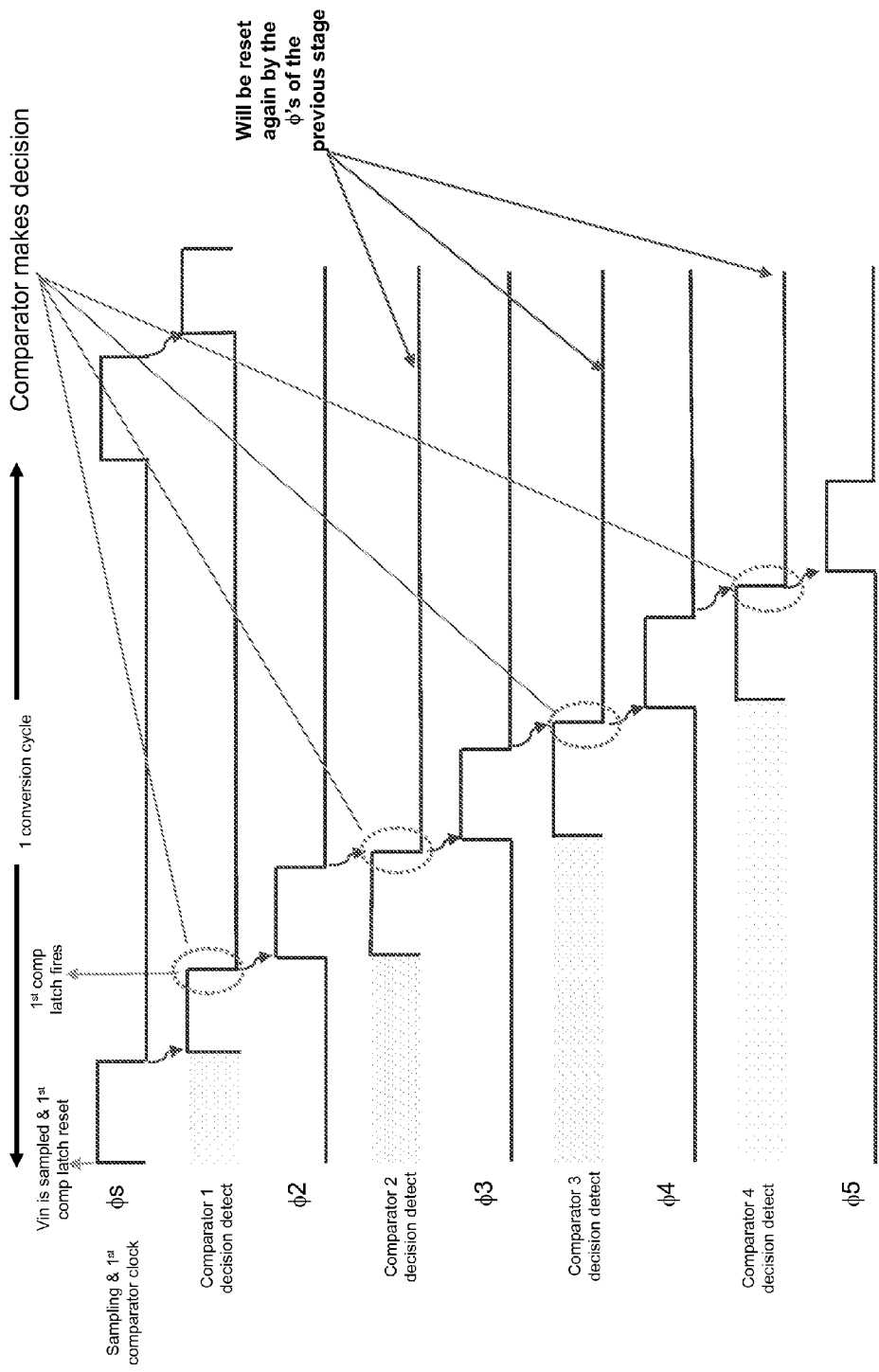

FIGS. 7A-7C are timing diagrams illustrating examples of clock pulses corresponding to the 2-bit, 3-bit, and 4-bit serial-ripple ADC circuits of FIGS. 5A-5C. In FIG. 7A, clock pulse (j), is a system clock, which triggers the sample and hold circuit (e.g., SH 440 of FIG. 4) to send the first sampled input signal to comparator C1 (e.g., of FIG. 5A) and resets comparator C1 internal latch (see FIGS. 11A-11B). Comparator C1 turns into active mode after the falling edge of system clock pulse $\phi_s$ and remains active during high state of pulse 710. After comparator C1 is done with its decision making the internal latch of comparator 1 (FIG. 11A, 1130) fires_(i.e. at the falling edge of $\phi_1$), which cause the second decision detect block 530 of FIG. 5A to generate, after a certain delay, clock pulse $\phi_2$, which resets internal latch of comparator C2. After completion of decision making by comparator C2, the internal latch of comparator 2 fires, which cause the third decision detect block 530 of FIG. 5A to generate, after a certain delay, clock pulse $\phi_3$, which triggers data latch 560 of FIG. 5A to provide the 2-bit digital output data to an external circuit. This ends the first conversion cycle. The next conversion cycle starts with the next rising edge of the system clock pulse $\phi_s$ and continues by going through similar sequence of actions as described above. In view of the above description, the timing diagrams corresponding to 3-bit, and 4-bit serial-ripple ADC circuits of FIGS. 5B-5C shown in FIGS. 7B-7C, which include additional clock pulses $\phi_4$ and $\phi_5$ are self explanatory.

Figure 8:
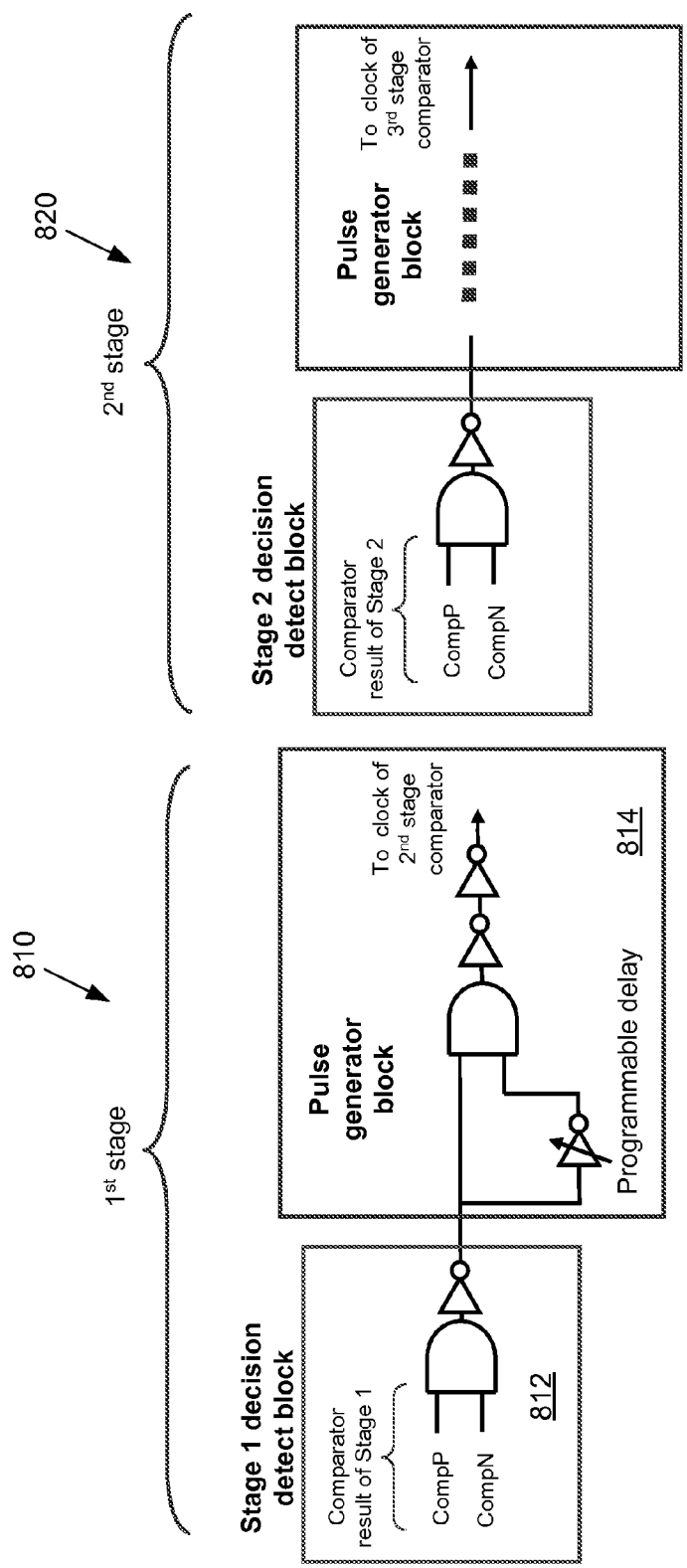
FIG. 8 is a diagram illustrating exemplary implementations of decision detect circuits of the serial-ripple ADC circuits of FIGS. 5A-5D.

FIG. 8 is a diagram illustrating exemplary implementations of decision detect circuits of the serial-ripple ADC circuits of FIGS. 5A-5D. Decision detect blocks 810 and 820 are similar and correspond to two successive decision detect blocks 530 (e.g., of FIG. 5A, 5B, or 5C). Decision detect block 810, for example, generates any of clock pulses $\phi_1$, $\phi_2$, $\phi_3$, $\phi_4$, and $\phi_5$ shown in FIGS. 7A-7C. which in turn trigger operation of comparators C1, C2, C3, C4, and data latch 560 of FIGS. 4A-4D. A logic 812 detects a change in the differential output signals CompP and CompN of a comparator (e.g., output signal 582 of comparator C1 of FIG. 4A), during a regeneration phase of the comparator, and generates an output pulse. The output pulse is received by pulse generator block 814, where a width (i.e. duration) of the output pulse is programmably adjusted through a chain of inverters.

Figure 9:
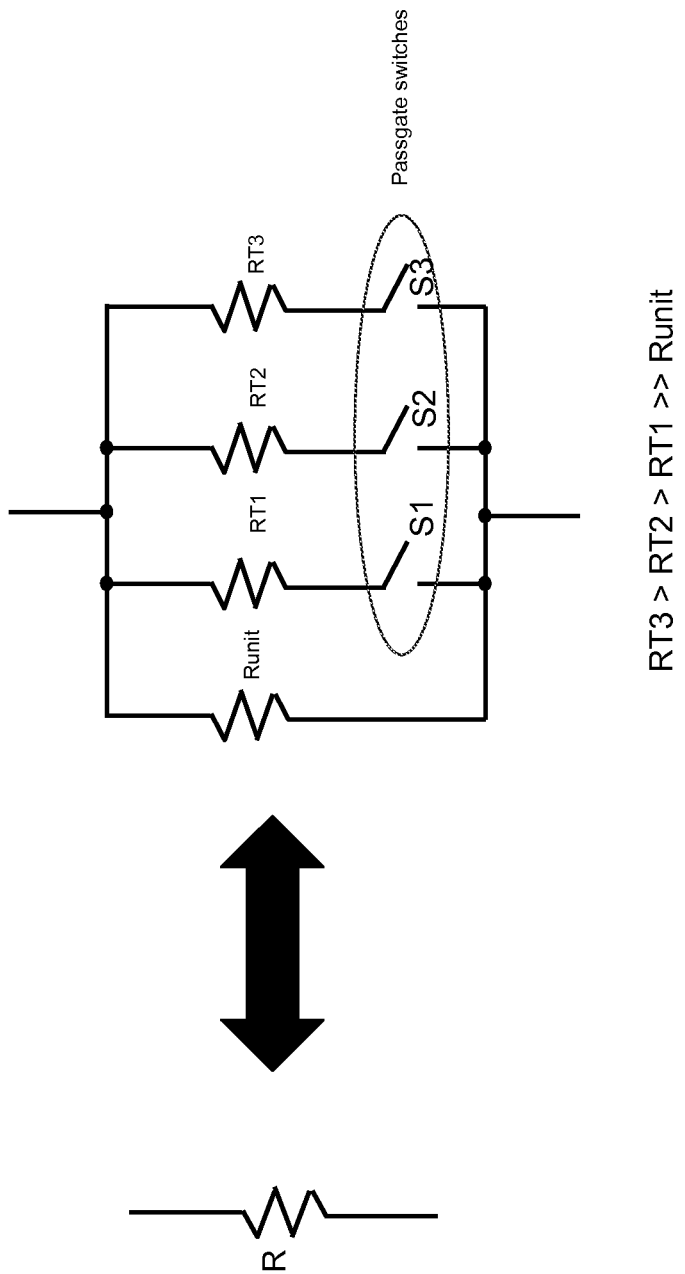
FIG. 9 is a diagram illustrating an exemplary implementation of a resistor element of a resistive ladder of the serial-ripple ADC circuits of FIGS. 5A and 5C-5D.

FIG. 9 is a diagram illustrating an exemplary implementation of a resistor element R of a resistive ladder of the serial-ripple ADC circuits of FIGS. 5A and 5C-5D. A resistive ladder may be formed by a number of resistor elements R as shown, for example, in FIG. 5A (e.g., reference generator ladder 510). Each resistor element R of the resistive ladder may be implemented by parallel combination of a number of branch resistors (e.g., Runit, RT1, RT2, and RT3) via switches (e.g., passage switches) S1, S2, and S3. Switches S1, S2, and S3 allow adding or removing any of the branch resistors from the combination therefore adjusting a resistance value of resistor element R. In one aspect, the resistance values of branch resistors RT1, RT2, and RT3 may be much larger than branch the resistance value of Runit. Therefore, Runit defines the maximum resistance value of resistor element R. Switches may be controlled by a control module (not shown for simplicity), which can be implemented, using known methods, in the form of hardware, firmware, or codes executable by one or more processors.

Figure 10A:
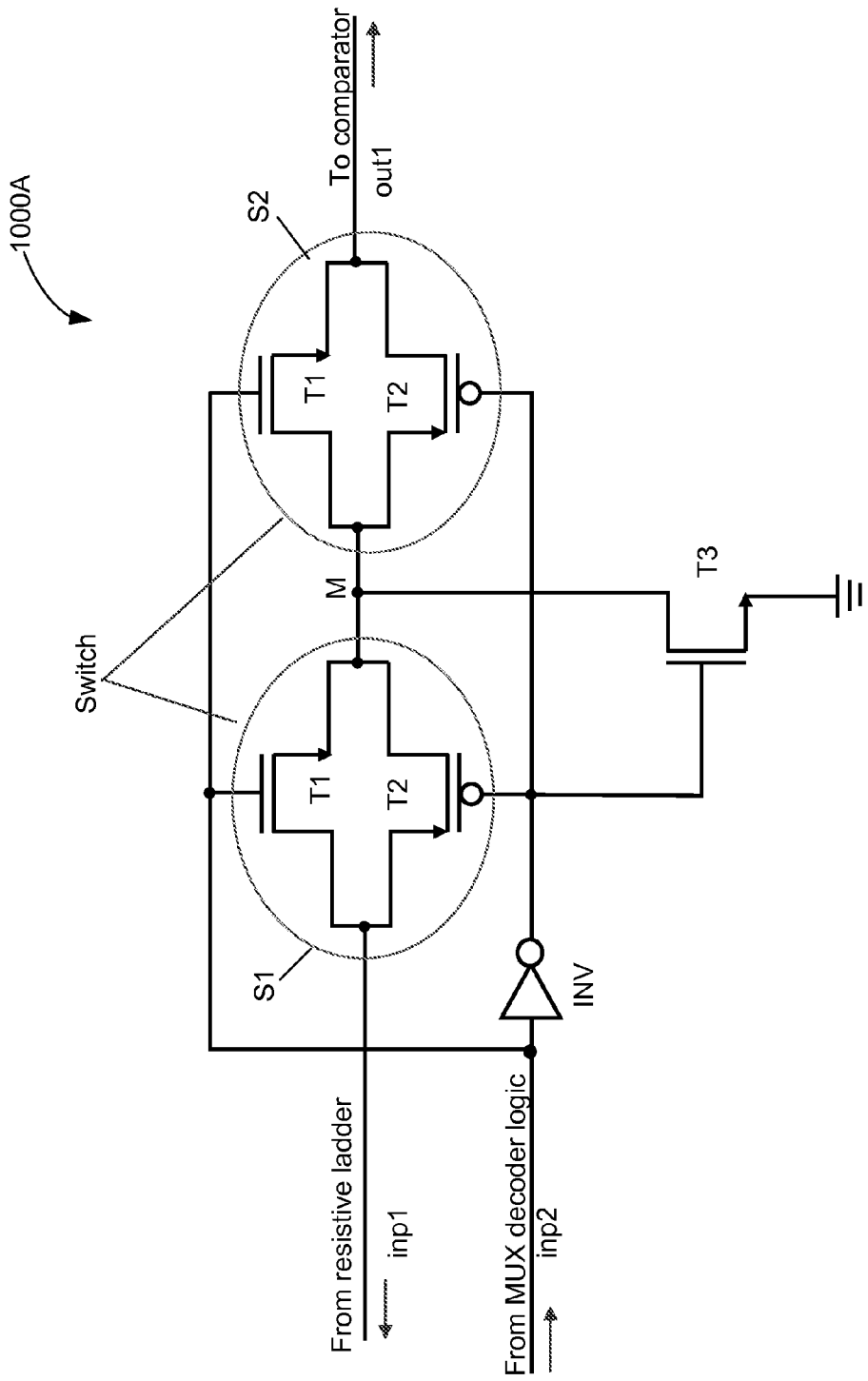
FIGS. 10A-10B are schematic diagrams illustrating exemplary implementations of an analog multiplexer circuit of the serial-ripple ADC circuits of FIGS. 5A-5D.
Figure 10B:
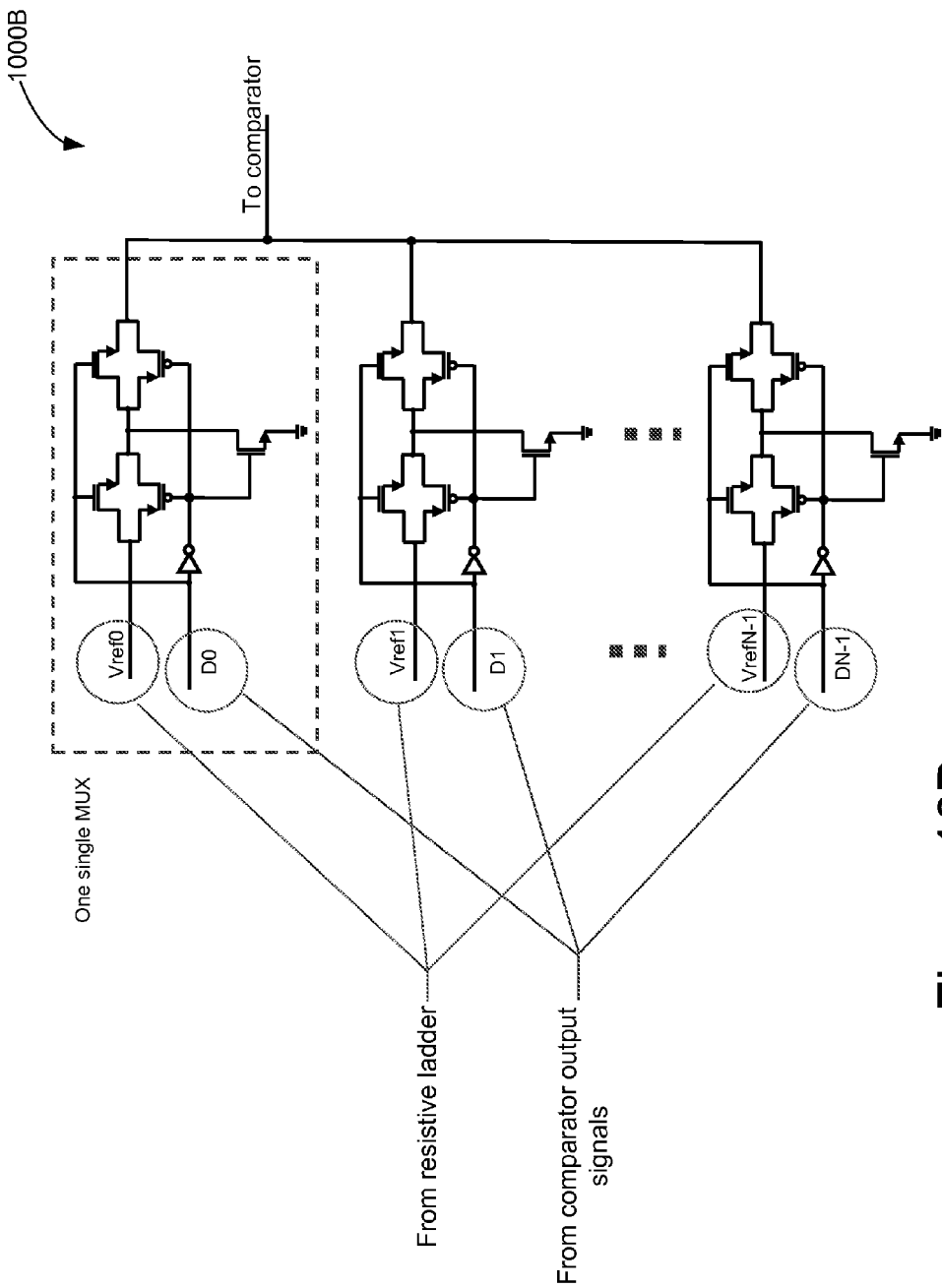

FIGS. 10A-10B are schematic diagrams illustrating exemplary implementations of analog multiplexer circuits of the serial-ripple ADC circuits of FIGS. 5A-5D. Analog multiplexer switch 1000A may operate to transfer a signal received at inp1 to output out1 only if the signal at inp2 is "1". Analog multiplexer switch 1000A is formed by two identical switches S1 and S2, inverter INV, and NMOS transistor T3. Each switch S1 (or S2) is formed by NMOS and PMOS transistors T1 and T2 connected in parallel. If signal at inp2 is "1", NMOS transistors T1 and PMOS transistors T2 conduct and transfer the signal at input inp1 to output out1. In this case, NMOS transistor T3 is off. If signal at inp2 is "0", NMOS transistors T1 and PMOS transistors T2 are off and isolate output out1 from the signal at input inp1. In this case, NMOS transistor T3 conducts and connects point M to ground potential.

Analog multiplexer 1000B is formed by a number of multiplexer switches similar to multiplexer switch 1000A, input inp1 of which are connected to a number of reference voltages Vref0-VrefN−1 (e.g., generated by a reference generator ladder) and input inp2 of which are coupled to bits D0 to DN−1 generated by a decoder from bits generated by comparators of a serial ripple ADC (e.g., serial ripple ADC of FIG. 5D). The decoder decodes the output bits of the corresponding comparators to bits D0 to DN−1 such that only one of bits D0 to DN−1 is '1', and the rests are "0", so only one of the Vref0-VrefN−1 is selected to be transferred to the next comparator.

FIGS. 11A-11B are schematic diagrams illustrating exemplary implementations of a comparator circuit of the serial-ripple ADC circuits of FIGS. 5A-5D. Comparator circuit 1100A is implemented in a differential form and includes a differential amplifier 1110, preamplifier 1120, and latch 1130, and output buffers 1140. Differential amplifier 1110, latch 1130 and buffers 1140 are well known blocks. The preamplifier 1120 may include a cascade of preamplifiers 1120 each inclining a differential amplifier 1122 coupled to a cross-coupled pair 1124. The cross-coupled pair includes a tunable/programmable capacitor C1 (also known a peaking capacitor), which allows broadening the bandwidth of the preamplifier 1120 without any adverse impact on the offset voltage of comparator 1100A. Comparator 1100B is similar to comparator 1100A, except for the preamplifier 1150, which may be formed by a cascade of preamplifiers 1150 each including a differential amplifier with capacitive degeneration formed with a lead-lag network 1152 coupling sources of the differential amplifier transistors to a current source 1154. Lead lag network 1152 may be configured to broaden the bandwidth of the preamplifier without any adverse effect on the offset voltage of comparator 1100B.

Figure 12:
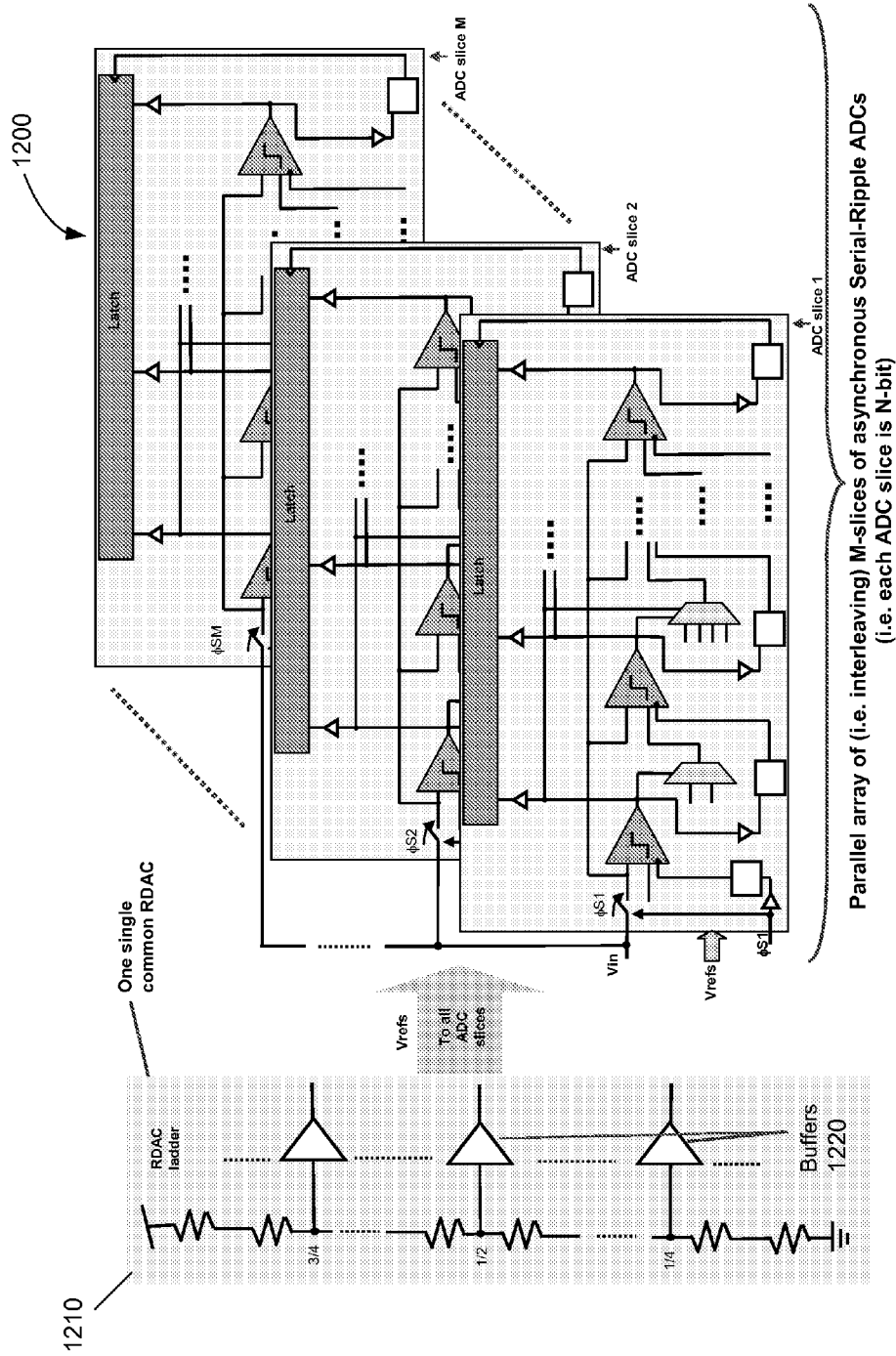
FIG. 12 is a diagram illustrating an exemplary implementation of an interleaved serial-ripple ADC device.

FIG. 12 is a diagram illustrating an exemplary implementation of an interleaved serial-ripple ADC device 1200. Interleaved serial-ripple ADC device 1200 includes parallel array of a number of (e.g., 8) serial-ripple ADC circuits (e.g., ADC slices) coupled to one or more reference generator ladders (e.g., resistive digital-to-analog conversion (RDAC) ladders). The structure and operation of each ADC slice is similar to N-bit serial-ripple ADC circuit of FIG. 5D. Reference voltages (i.e., Vrefs) produced by RDAC ladder 1210 are coupled to each ADC slice through a number of (e.g., $(2^N-1)$ for N-bit ADC slices) buffers 1220, which help in preventing cross talk and kickbacks. In the architecture shown in FIG. 12, only one RDAC ladder is used to provide Vrefs to all ADC slices. In some aspects, a number of RDAC ladders may be used to provide Vrefs to ADC slices. Although the ADC slice of the serial-ripple ADC device 1200 operates in parallel, but each slice produces the same digital output signal in a specific time interval. Therefore, in a time period (e.g., one cycle) of the ADC device 1200 a number of times (e.g., M times, M being the number of ADC slices, for example, 8) such digital output signal is provided, which translates into a significantly (e.g., M times, such as 8 times) higher conversion rate.

Figure 13:
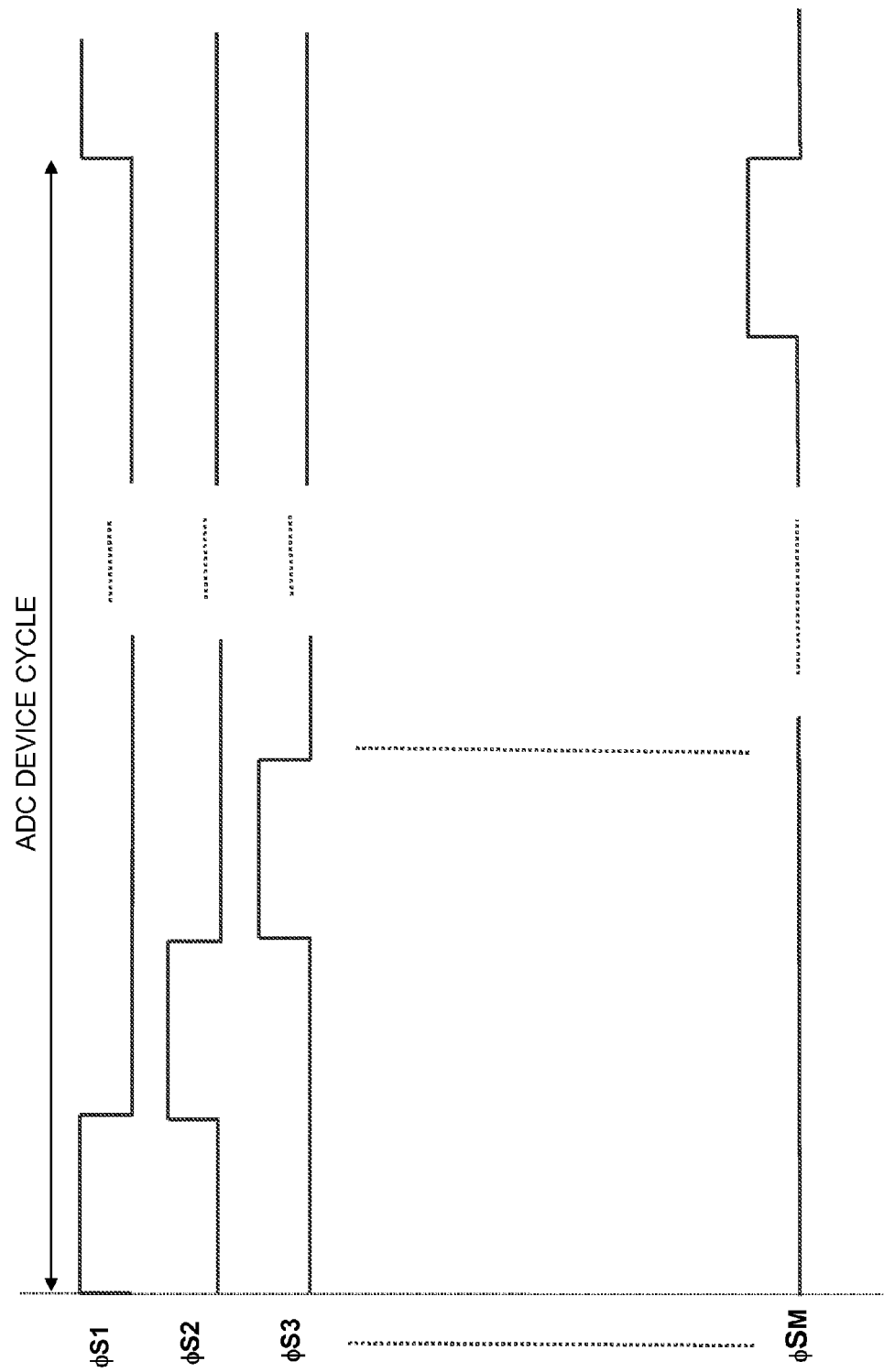
FIG. 13 is a timing diagram illustrating examples of clock pulses corresponding to the various ADC circuits of the interleaved serial-ripple ADC device of FIG. 12

FIG. 13 is a timing diagram illustrating examples of clock pulses corresponding to the various ADC circuits of the interleaved serial-ripple ADC device 1200 of FIG. 12. The interleave operation is controlled by a series of (e.g., M, such as 8) subsequent system clock pulses $\phi_{s1}$, $\phi_{s1}$ ... $\phi_{sM}$, as shown in FIG. 13. A time period of each of the system clock pulses $\phi_{s1}$, $\phi_{s1}$ ... $\phi_{sM}$ may be M times smaller than the cycle of ADC device 1200.

Figure 14:
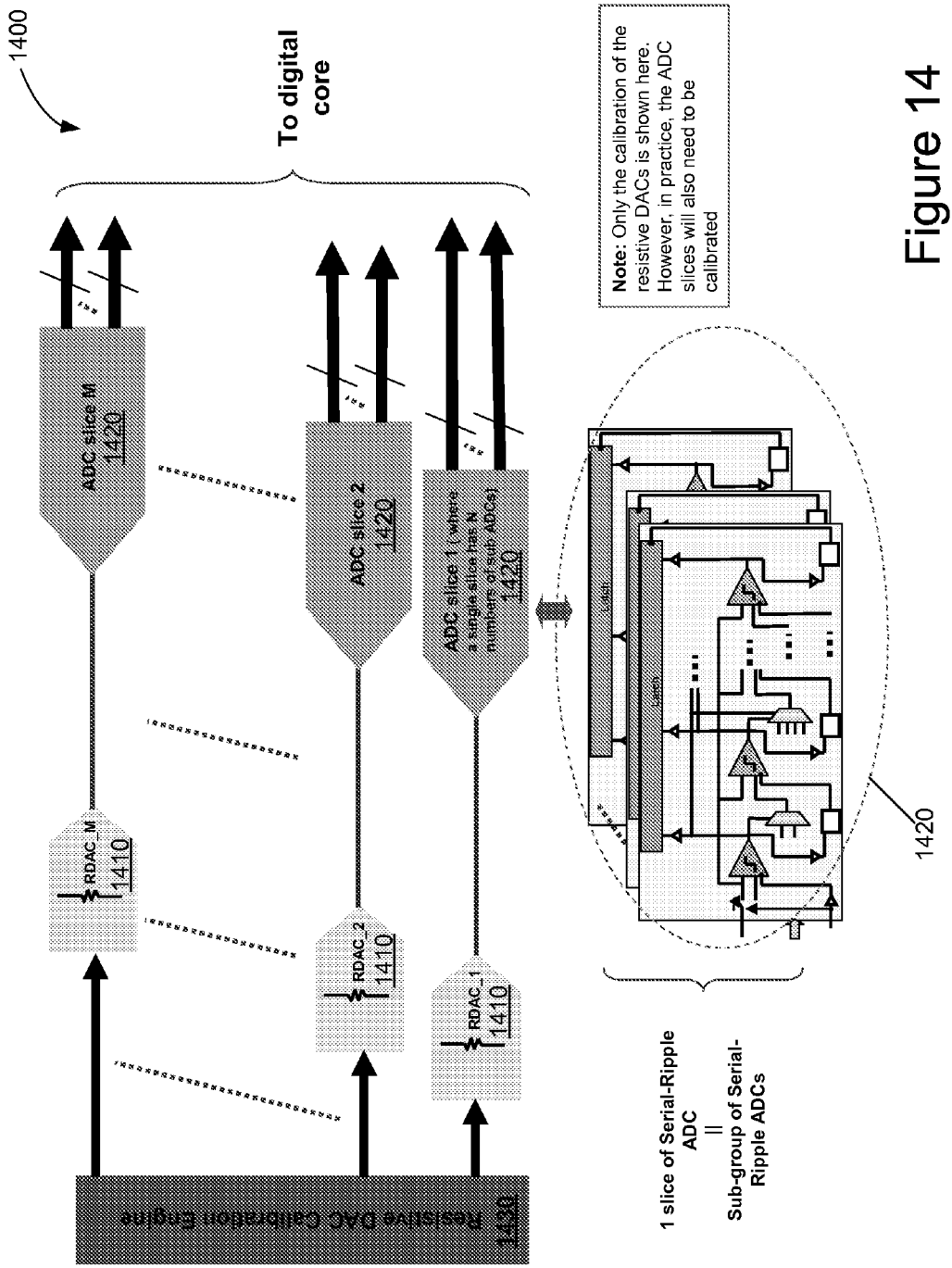
FIG. 14 is a diagram illustrating an exemplary implementation of an interleaved serial-ripple ADC device using multiple resistive digital-to-analog conversion (DAC) circuits.

FIG. 14 is a diagram illustrating an exemplary implementation of an interleaved serial-ripple ADC device 1400 using multiple RDAC ladders. In the serial-ripple ADC device 1400, Each ADC slice 1420 may include a number of (e.g., 8) serial-ripple ADC circuits (e.g., ADC circuit 500D of FIG. 5D). Each ADC slice 1420 is coupled to RDAC ladder 1410. An RDAC calibration engine 1430 may control the adjustment of resistive elements R (see FIG. 9) of RDAC ladders 1410. RDAC calibration engine 1430 can be implemented, using known methods, in the form of hardware, firmware, or codes executable by one or more processors.

Illustration of Subject Technology as Clauses

Various examples of aspects of the disclosure are described as numbered clauses (1, 2, 3, etc.) for convenience. These are provided as examples, and do not limit the subject technology. Identifications of the figures and reference numbers are provided below merely as examples and for illustrative purposes, and the clauses are not limited by those identifications.

1. An analog-to-digital conversion (ADC) circuit to convert an analog input signal to a digital output signal (e.g., ADC circuits 400 of FIGS. 4 and 500A-500D of FIGS. 5A-5D), comprising:

a plurality of conversion stages (e.g., multiple 410's of FIG. 4) coupled in series, each of the plurality of conversion stages configured to generate a bit (e.g., bit D1 of FIG. 5A) for the digital output signal (e.g., 562 of FIG. 5A; and a data latch (e.g., 560 of FIGS. 5A-5C) configured to receive bits for the digital output signal from the plurality of conversion stages and to provide the digital output signal based on the bits;

wherein a conversion stage of the plurality of conversion stages includes:

a comparator circuit (e.g., comparators C1, C2, C3, and C4 of FIGS. 5A-5C) configured to compare a sampled input signal (e.g., Vin of FIG. 5A) with a reference signal (e.g., ref1, ref2, ref3, or ref4 of FIGS. 5A-5C) and to generate the associated bit for the digital output signal based on a result of the comparison; and a multiplexer circuit (e.g., 520 of FIG. 5A) configured to provide an associated reference signal to a comparator circuit (e.g., comparator C2 of FIG. 5A) of a next conversion stage, the next conversion stage being subsequent to the conversion stage.

2. The ADC circuit of clause 1, wherein a first conversion stage of the plurality of conversion stages is configured to generate the most significant bit (MSB) (e.g., D1 of FIG. 5A) for the digital output signal, and wherein a last conversion stage of the plurality of conversion stages is configured to generate the least significant bit (LSB) (e.g., D0 of FIGS. 5A-5C) for the digital output signal.

3. The ADC circuit of clause 1, wherein the multiplexer circuit is an analog multiplexer circuit (e.g., 1000B of FIG. 10B) and is further configured to select one of a plurality of input reference signals (e.g., generated by reference generator ladder 510 of FIG. 5A) to provide the associated reference signal (e.g., ref2 of FIG. 5A).

4. The ADC circuit of clause 3, wherein the multiplexer circuit is further configured to select, in response to at least one select signal, one of a plurality of input reference signals to provide the associated reference signal.

5. The ADC circuit of clause 4, wherein the at least one select signal comprises one or more bits (e.g., bits D1 and D2 in FIG. 5B) generated by one or more prior conversion stages, the one or more prior conversion stages preceding the conversion stage.

6. The ADC circuit of clause 4, further comprising a reference generator circuit (e.g., 510 of FIG. 5A or 512 of FIG. 5C) configured to provide the plurality of input reference signals.

7. The ADC circuit of clause 6, wherein the reference generator circuit comprises a resistive ladder circuit (e.g., 510 of FIG. 5A or 512 of FIG. 5C).

8. The ADC circuit of clause 6, wherein the ADC circuit is an N-bit ADC circuit and comprises N conversion stages, wherein the reference generator circuit is configured to generate ($2^N$–1) input reference signals, wherein N is an integer greater than zero.

9. The ADC circuit of clause 8, wherein the reference generator circuit is configured to generate ($2^N$–1) input reference signals, using a reference voltage Vref, with magnitude increments of Vref/2N.

10. The ADC circuit of clause 1, wherein the ADC circuit comprises an asynchronous serial-ripple ADC configured to receive an external clock signal (e.g., $\phi_s$ of FIGS. 5A-5C) to trigger a comparator of a first conversion stage of the plurality of conversion stages and to generate a plurality of clock pulses ($\phi_1$, $\phi_2$, $\phi_3$, or $\phi_N$ of FIGS. 5A-5D) to trigger comparator circuits of other conversion stages of the plurality of conversion stages.

11. The ADC circuit of clause 10, wherein the conversion stage of the plurality of conversion stages further comprises a decision detect circuit (e.g., 530 of FIGS. 5A-5D) configured to generate a clock pulse of the plurality of clock pulses in response to detecting the bit generated by a comparator circuit of a prior conversion stage, the prior conversion stage preceding the conversion stage.

12. The ADC circuit of clause 10, wherein a comparator circuit (e.g., C2 of FIGS. 5A-5D) of a conversion stage other than the first conversion stage is configured to be triggered by the clock pulse (e.g., $\phi_2$ of FIGS. 5A-5D) generated by the prior conversion stage.

13. The ADC circuit of clause 11, further comprising a power down module (e.g., 590 of FIG. 5D) configured to power down the comparator circuit of the conversion stage, in response to receiving a clock pulse of the plurality of clock pulses generated by the decision detect circuit of the conversion stage.

14. The ADC circuit of clause 1, further comprising a sample-and-hold circuit (e.g., 440 of FIG. 4) configured to generate the sampled input signal from the input analog signal.

15. An analog-to-digital conversion (ADC) device (e.g., 1200 of FIG. 12) to convert an analog input signal to a digital output signal, comprising:

a plurality of ADC circuits (e.g., 500D's of FIG. 5D), each of the plurality of ADC circuits configured to generate the digital output signal at a time interval of a plurality of time intervals; and at least one reference generator circuit configured to provide a plurality of input reference signals;

wherein each of the plurality of ADC circuits includes:

a plurality of conversion stages coupled in series, each of the plurality of conversion stages configured to generate a bit for the digital output signal; and a data latch configured to receive the bits for the digital output signal from the plurality of conversion stages and to provide the digital output signal based on the bits; and wherein a conversion stage of the plurality of conversion stages includes:

a comparator circuit configured to compare a sampled input signal with a reference signal and generate the associated bit for the digital output signal based on a result of the comparison; and a multiplexer circuit configured to provide an associated reference signal to a comparator circuit of a next conversion stage, the next conversion stage being subsequent to the conversion stage.

16. The ADC device of clause 15, wherein the multiplexer circuit is further configured to select, in response to at least one select signal, one of the plurality of input reference signals to provide the associated reference signal, and wherein the at least one select signal comprises one or more bits generated by one or more prior conversion stages, the one or more prior conversion stages preceding the conversion stage.

Figure 15:
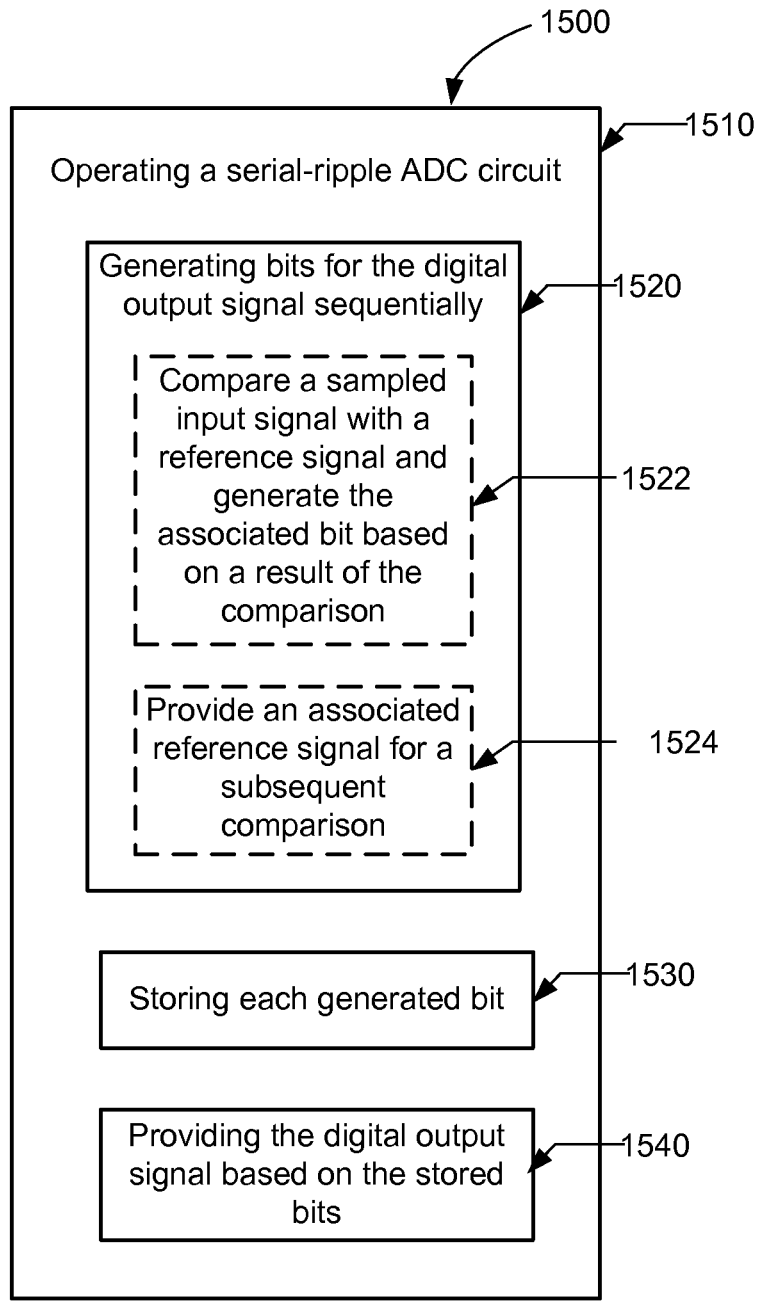
FIG. 15 is a flow diagram illustrating an example of a method of operation of a serial ripple ADC circuit.

17. A method of operating an analog-to-digital conversion (ADC) circuit to convert an analog input signal to a digital output signal (e.g., 1510 of FIG. 15), comprising:

generating bits for the digital output signal sequentially (e.g., 1520 of FIG. 15);

storing each generated bit (e.g., 1530 of FIG. 15); and providing the digital output signal based on the stored bits (e.g., 1540 of FIG. 15);

wherein generating the bits for the digital output signal includes:

comparing a sampled input signal with a reference signal and generating the associated bit for the digital output signal based on a result of the comparison (e.g., 1522 of FIG. 15); and providing an associated reference signal for a subsequent comparison (e.g., 1524 of FIG. 15).

18. The method of clause 17, wherein storing each generated bit includes storing a first generated bit as a most significant bit (MSB) for the digital output signal and storing a last generated bit as a least significant bit (LSB) for the digital output signal.

19. The method of clause 17, further comprising:
providing a plurality of input reference signals; and
selecting, in response to at least one select signal, one of the plurality of input reference signals to provide the associated reference signal;
wherein the at least one select signal comprises one or more prior generated bits.

20. The method of clause 17, further comprising operating a plurality of ADC circuits similar to the ADC circuit so that each of the plurality of ADC circuits generate the digital output signal at a time interval of a plurality of time intervals.

21. The method of clause 17, further comprising generating a clock pulse in response to detecting a prior generated bit.

22. The method of clause 17, further comprising powering down a portion of the ADC circuit in response to receiving the clock pulse.

Figure 16:
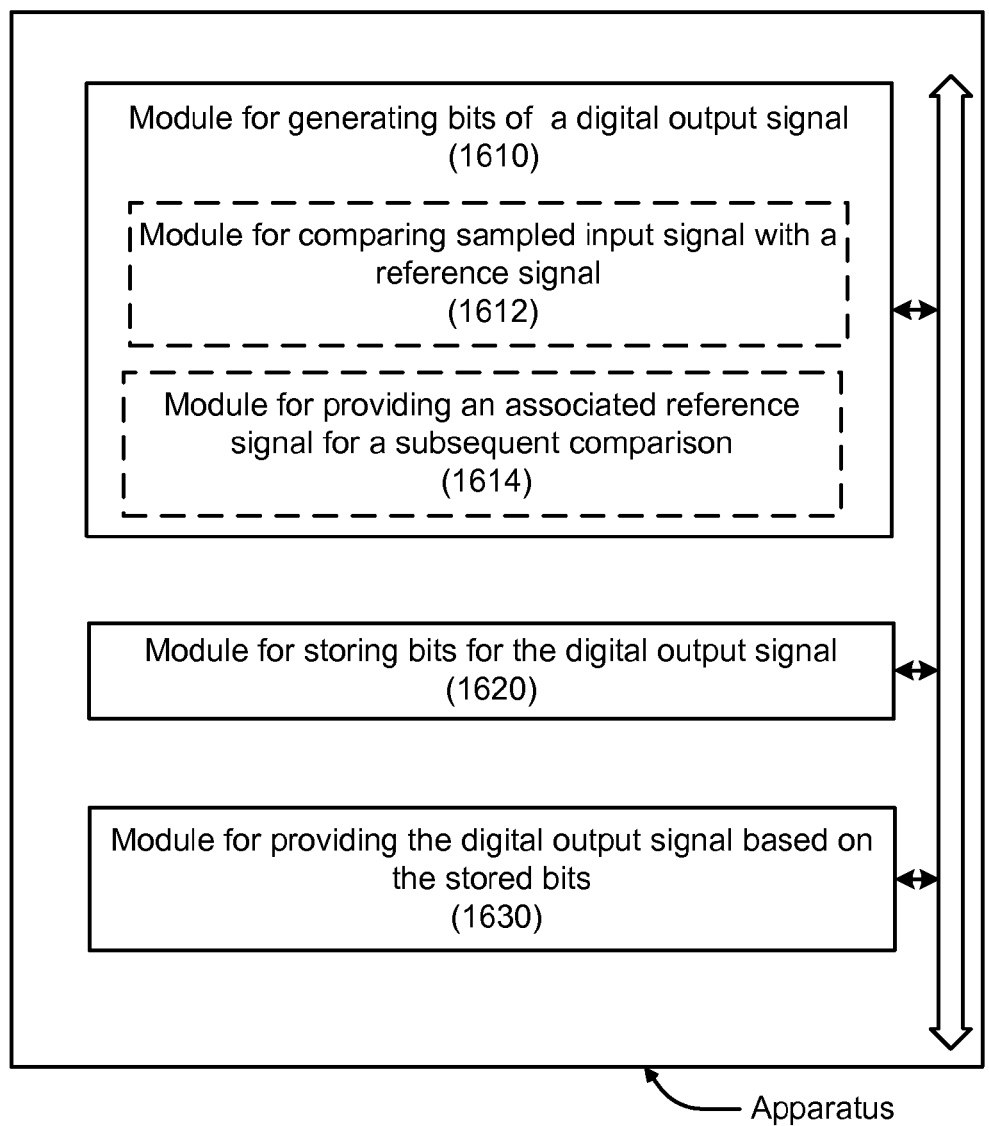
FIG. 16 is a diagram illustrating an exemplary apparatus for performing ADC.

23. An analog-to-digital conversion (ADC) circuit comprising means adapted for performing the method of any one of clauses 17-22 (Apparatus of FIG. 16).

24. A hardware apparatus comprising circuits configured to perform the method of any one of clauses 17-22 (Apparatus of FIG. 16).

Other Remarks

In one aspect, any of the clauses herein may depend from any one of the independent clauses or any one of the dependent clauses. In one aspect, any of the clauses (e.g., dependent or independent clauses) may be combined with any other clauses (e.g., dependent or independent clauses). In one aspect, a claim may include some or all of the words (e.g., steps, operations, means or components) recited in a clause, a sentence, a phrase or a paragraph. In one aspect, a claim may include some or all of the words recited in one or more clauses, sentences, phrases or paragraphs. In one aspect, some of the words in each of the clauses, sentences, phrases or paragraphs may be removed. In one aspect, additional words or elements may be added to a clause, a sentence, a phrase or a paragraph. In one aspect, the subject technology may be implemented without utilizing some of the components, elements, functions or operations described herein. In one aspect, the subject technology may be implemented utilizing additional components, elements, functions or operations.

In one aspect, any methods, instructions, code, means, logic, components, blocks, modules and the like (e.g., software or hardware) described or claimed herein can be represented in drawings (e.g., flow charts, block diagrams), such drawings (regardless of whether explicitly shown or not) are expressly incorporated herein by reference, and such drawings (if not yet explicitly shown) can be added to the disclosure without constituting new matter. For brevity, some (but not necessarily all) of the clauses/descriptions/claims are explicitly represented in drawings, but any of the clauses/descriptions/claims can be represented in drawings in a manner similar to those drawings explicitly shown. For example, a flow chart can be drawn for any of the clauses, sentences or claims for a method such that each operation or step is connected to the next operation or step by an arrow. In another example, a block diagram can be drawn for any of the clauses, sentences or claims having means-for elements (e.g., means for performing an action) such that each means-for element can be represented as a module for element (e.g., a module for performing an action).

Those of skill in the art would appreciate that items such as the various illustrative blocks, modules, elements, components, methods, operations, steps, and algorithms described herein may be implemented as hardware or a combination off hardware and software.

To illustrate the interchangeability of hardware and software, items such as the various illustrative blocks, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

In one aspect, "means," a block, a module, an element, a component or a processor may be an item (e.g., one or more of blocks, modules, elements, components or processors) for performing one or more functions or operations. In one aspect, such an item may be an apparatus, hardware, or a portion thereof. In an example, an item may be implemented as one or more circuits configured to perform the function(s) or operation(s). A circuit may include one or more circuits and/or logic. A circuit may be analog and/or digital. A circuit may be electrical and/or optical. A circuit may include transistors. In an example, one or more items may be implemented as a processing system (e.g., a digital signal processor (DSP), an application specific integrated circuit (ASIC), a field programmable gate array (FPGA), etc.). In one example, an item may also include a structure in the form of, for example, an instruction(s) for performing the function(s) or operation(s), where the instruction(s) are encoded or stored on a machine-readable medium, on another device, or on a portion thereof, where an instruction(s) may be software, an application(s), a subroutine(s), or a portion thereof. Those skilled in the art will recognize how to implement the instructions, circuits, and processing systems.

A reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals.

Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The word "exemplary" is used herein to mean "serving as an example or illustration." Any aspect or design described herein as "exemplary" is not necessarily to be construed as preferred or advantageous over other aspects or designs. In one aspect, various alternative configurations and operations described herein may be considered to be at least equivalent.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

In one aspect of the disclosure, when actions or functions are described as being performed by an item (e.g., receiving, determining, providing, generating, converting, displaying, notifying, accepting, selecting, controlling, transmitting, reporting, sending, or any other action or function), it is understood that such actions or functions may be performed by the item directly or indirectly. In one aspect, when a module is described as performing an action, the module may be understood to perform the action directly. In one aspect, when a module is described as performing an action, the module may be understood to perform the action indirectly, for example, by facilitating, enabling or causing such an action.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled" or the like may refer to being directly coupled. In another aspect, the term "coupled" or the like may refer to being indirectly coupled.

Various items may be arranged differently (e.g., arranged in a different order, or partitioned in a different way) all without departing from the scope of the subject technology. In one aspect of the disclosure, the elements recited in the accompanying claims may be performed by one or more modules or sub-modules.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. Some or all of the steps, operations, or processes may be performed automatically, without the intervention of a user. The accompanying method claims, if any, present elements of the various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

In one aspect, a transistor may refer to a bipolar junction transistor, a field effect transistor, or the like. In one aspect, capacitors and resistors may be implemented using transistor or diode elements. The subject technology, however, is not limited to these exemplary numbers, and can be implemented with other numbers of bits or components.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Summary, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirement of 35 U.S.C. §101, 102, or 103, nor should they be interpreted in such a way. Any unintended embracement of such subject matter is hereby disclaimed.

What is claimed is:

1. An analog-to-digital conversion (ADC) circuit to convert an analog input signal to a digital output signal, comprising:
   a plurality of conversion stages coupled in series, each of the plurality of conversion stages configured to generate a bit for the digital output signal; and
   a data latch configured to receive bits for the digital output signal from the plurality of conversion stages and to provide the digital output signal based on the bits;
   wherein a conversion stage of the plurality of conversion stages includes:
   a comparator circuit configured to compare a sampled input signal with a reference signal and to generate an associated bit for the digital output signal based on a result of the comparison; and
   a multiplexer circuit configured to provide an associated reference signal to a comparator circuit of a next conversion stage, the next conversion stage being subsequent to the conversion stage, and
   wherein the ADC circuit comprises an asynchronous serial-ripple ADC configured to receive an external clock signal to trigger a comparator of a first conversion stage of the plurality of conversion stages and to generate a plurality of clock pulses to trigger comparator circuits of other conversion stages of the plurality of conversion stages.

2. The ADC circuit of claim 1, wherein a first conversion stage of the plurality of conversion stages is configured to generate the most significant bit for the digital output signal, and wherein a last conversion stage of the plurality of conversion stages is configured to generate the least significant bit (LSB) for the digital output signal.

3. The ADC circuit of claim 1, wherein the multiplexer circuit is an analog multiplexer circuit and is further configured to select one of a plurality of input reference signals to provide the associated reference signal.

4. The ADC circuit of claim 3, wherein the multiplexer circuit is further configured to select, in response to at least one select signal, one of a plurality of input reference signals to provide the associated reference signal.

5. The ADC circuit of claim 4, wherein the at least one select signal comprises one or more bits generated by one or more prior conversion stages, the one or more prior conversion stages preceding the conversion stage.

6. The ADC circuit of claim 4, further comprising a reference generator circuit configured to provide the plurality of input reference signals.

7. The ADC circuit of claim 6, wherein the reference generator circuit comprises a resistive ladder circuit.

8. The ADC circuit of claim 6, wherein the ADC circuit is an N-bit ADC circuit and comprises N conversion stages, wherein the reference generator circuit is configured to generate ($2^N$−1) input reference signals, wherein N is an integer greater than zero.

9. The ADC circuit of claim 8, wherein the reference generator circuit is configured to generate ($2^N$−1) input reference signals, using a reference voltage Vref, with magnitude increments of Vref/2N.

10. The ADC circuit of claim 1, wherein the conversion stage of the plurality of conversion stages further comprises a decision detect circuit configured to generate a clock pulse of the plurality of clock pulses in response to detecting an associated bit generated by a comparator circuit of a prior conversion stage, the prior conversion stage preceding the conversion stage.

11. The ADC circuit of claim 1, wherein a comparator circuit of a conversion stage other than the first conversion stage is configured to be triggered by a clock pulse of the plurality of clock pulses generated by the prior conversion stage.

12. The ADC circuit of claim 11, further comprising a power down module configured to power down the comparator circuit of the conversion stage, in response to receiving the clock pulse of the plurality of clock pulses generated by the decision detect circuit of the conversion stage.

13. The ADC circuit of claim 1, further comprising a sample-and-hold circuit configured to generate the sampled input signal from the input analog signal.

14. An analog-to-digital conversion (ADC) device to convert an analog input signal to a digital output signal, comprising:
a plurality of ADC circuits each of the plurality of ADC circuits configured to generate the digital output signal at a time interval of a plurality of time intervals; and
at least one reference generator circuit configured to provide a plurality of input reference signals;
wherein each of the plurality of ADC circuits includes:
a plurality of conversion stages coupled in series, each of the plurality of conversion stages configured to generate a bit for the digital output signal; and
a data latch configured to receive the bits for the digital output signal from the plurality of conversion stages and to provide the digital output signal based on the bits; and
wherein a conversion stage of the plurality of conversion stages includes:
a comparator circuit configured to compare a sampled input signal with a reference signal and generate an associated bit for the digital output signal based on a result of the comparison; and
a multiplexer circuit configured to provide an associated reference signal to a comparator circuit of a next conversion stage, the next conversion stage being subsequent to the conversion stage, and
wherein each of the plurality of ADC circuits comprises an asynchronous serial-ripple ADC configured to receive an external clock signal to trigger a comparator of a first conversion stage of the plurality of conversion stages and to generate a plurality of clock pulses to trigger comparator circuits of other conversion stages of the plurality of conversion stages.

15. The ADC device of claim 14, wherein the multiplexer circuit is further configured to select, in response to at least one select signal, one of the plurality of input reference signals to provide the associated reference signal, and wherein the at least one select signal comprises one or more bits generated by one or more prior conversion stages, the one or more prior conversion stages preceding the conversion stage.

16. A method of operating an analog-to-digital conversion (ADC) circuit to convert an analog input signal to a digital output signal, comprising:
generating a plurality of bits for the digital output signal such that each bit of the plurality of bits is generated sequentially;
storing each generated bit; and
providing the digital output signal based on the stored bits;
wherein generating the plurality of bits for the digital output signal includes:
comparing a sampled input signal with a first reference signal and generating a first bit of the plurality of bits for the digital output signal based on a result of the comparing the sampled input signal with the first reference signal, and
generating a clock pulse in response to detecting the first generated bit.

17. The method of claim 16, wherein the storing each generated bit includes storing the first generated bit as a most significant bit (MSB) for the digital output signal and storing a last generated bit of the plurality of bits as a least significant bit (LSB) for the digital output signal.

18. The method of claim 16, further comprising operating a plurality of ADC circuits similar to the ADC circuit so that each of the plurality of ADC circuits generate the digital output signal at a time interval of a plurality of time intervals.

19. The method of claim 16, further comprising powering down a portion of the ADC circuit in response to receiving a clock pulse.

20. The method of claim 16, wherein generating the plurality of bits for the digital output signal further includes:
comparing the sampled input signal with a second reference signal, the second reference signal being based at least partially on the first generated bit, and generating a second bit of the plurality of bits for the digital output signal based on a result of the comparing the sampled input signal with the second reference signal.

21. The method of claim 20, further comprising:
providing a plurality of input reference signals; and
selecting, in response to at least one select signal, one of the plurality of input reference signals to provide a second reference signal.

* * * * *